(12) United States Patent
Michel

(10) Patent No.: US 11,962,277 B2
(45) Date of Patent: Apr. 16, 2024

(54) SWITCHED-CAPACITOR AMPLIFIER AND PIPELINED ANALOG-TO-DIGITAL CONVERTER COMPRISING THE SAME

(71) Applicant: ams International AG, Jona (CH)

(72) Inventor: Fridolin Michel, Au (CH)

(73) Assignee: AMS INTERNATIONAL AG, Jona (CH)

( * ) Notice: Subject to any disclaimer, the term of this patent is extended or adjusted under 35 U.S.C. 154(b) by 128 days.

(21) Appl. No.: 17/779,823

(22) PCT Filed: Nov. 18, 2020

(86) PCT No.: PCT/EP2020/082503
§ 371 (c)(1),
(2) Date: May 25, 2022

(87) PCT Pub. No.: WO2021/104960
PCT Pub. Date: Jun. 3, 2021

(65) Prior Publication Data
US 2023/0012330 A1    Jan. 12, 2023

(30) Foreign Application Priority Data

Nov. 26, 2019 (EP) .................................. 19211524

(51) Int. Cl.
*H03M 1/38* (2006.01)
*G04F 10/00* (2006.01)
(Continued)

(52) U.S. Cl.
CPC ....... *H03F 3/45179* (2013.01); *G04F 10/005* (2013.01); *H03M 1/0607* (2013.01); *H03F 2200/78* (2013.01)

(58) Field of Classification Search
CPC ........ H03M 1/468; H03M 1/164; H03M 1/38; H03M 1/145; H03M 1/0607;
(Continued)

(56) References Cited

U.S. PATENT DOCUMENTS

| 4,649,372 A | 3/1987 | Abe et al. |
| 6,177,901 B1 * | 1/2001 | Pan .......................... H03M 1/56 341/166 |

(Continued)

FOREIGN PATENT DOCUMENTS

| JP | S58-164318 A | 9/1983 |
| JP | 2003243986 A | 8/2003 |

(Continued)

OTHER PUBLICATIONS

Japanese Office Action issued in corresponding Japanese Patent Application No. 2022-529329 dated Jul. 18, 2023, with English language translation attached, 19 pages.

(Continued)

*Primary Examiner* — Linh V Nguyen
(74) *Attorney, Agent, or Firm* — MH2 TECHNOLOGY LAW GROUP LLP

(57) ABSTRACT

A switched-capacitor amplifier comprises a comparator, sample and amplification capacitors and a controller to control charge and discharge current sources in dependence on an output signal of the comparator. A closed loop control circuit is configured to determine the delay of the comparator and control an offset of the comparator in response to the determined delay.

16 Claims, 15 Drawing Sheets

(51) Int. Cl.
*H03F 3/45* (2006.01)
*H03M 1/06* (2006.01)

(58) Field of Classification Search
CPC .. H03M 1/1215; H03M 1/125; H03M 1/1245; H03M 1/442; H03M 1/50; H03M 1/141; H03M 1/54; H03M 1/56; H03M 1/0602; H03M 1/0604; H03M 1/0609; H03M 1/0634; H03M 1/0863; H03M 1/1009; H03M 1/1023; H03M 1/1038; H03M 1/1042; H03M 1/1205; H03M 1/121; H03M 1/123; H03M 1/124; H03M 1/126; H03M 1/1295; H03M 1/16; H03M 1/162; H03M 1/167; H03M 1/168; H03M 1/201; H03M 1/362; H03M 1/42; H03M 1/46; H03M 1/52; H03M 1/60; H03M 1/804; H03M 3/30; H03M 3/426; H03M 3/442; H03M 3/454
USPC .................. 341/118–122, 155, 161, 172
See application file for complete search history.

(56) References Cited

U.S. PATENT DOCUMENTS

| | | | | |
|---|---|---|---|---|
| 7,164,379 | B1* | 1/2007 | Rao | H03M 1/52 341/161 |
| 7,459,942 | B2* | 12/2008 | Lee | G11C 27/024 327/78 |
| 7,737,732 | B2* | 6/2010 | Lee | G11C 27/024 327/91 |
| 9,143,146 | B1* | 9/2015 | Pereira | H03M 1/121 |
| 9,219,490 | B1* | 12/2015 | Pereira | H03M 1/007 |
| 9,362,936 | B1 | 6/2016 | Caffee et al. | |
| 9,438,260 | B1* | 9/2016 | Ebata | H03M 1/1038 |
| 9,483,028 | B1* | 11/2016 | Kinyua | G04F 10/005 |
| 9,595,974 | B1* | 3/2017 | Pereira | H03M 1/164 |
| 9,673,835 | B1* | 6/2017 | Kinyua | H03M 1/0607 |
| 2006/0208938 | A1* | 9/2006 | Fiorenza | H03F 3/005 341/172 |
| 2007/0229038 | A1 | 10/2007 | Lin | |
| 2010/0090724 | A1 | 4/2010 | Wolf et al. | |
| 2010/0328119 | A1 | 12/2010 | Kobayashi et al. | |
| 2011/0169340 | A1* | 7/2011 | Straayer | H02M 3/07 307/109 |
| 2011/0215956 | A1 | 9/2011 | Ishikawa | |
| 2017/0070695 | A1 | 3/2017 | Shinozuka et al. | |
| 2019/0296756 | A1* | 9/2019 | Ali | H03F 1/301 |
| 2022/0337258 | A1* | 10/2022 | Shen | G11C 27/024 |

FOREIGN PATENT DOCUMENTS

| | | |
|---|---|---|
| JP | 2010093818 A | 4/2010 |
| JP | 2011188097 A | 9/2011 |
| JP | 2017055241 A | 3/2017 |

OTHER PUBLICATIONS

Jespers, Michael (EP Authorized Officer), International Search Report and Written Opinion in corresponding International Application No. PCT/EP2020/082503 dated Jan. 21, 2021, 16 pages.

Brooks et al., "A Zero-Crossing-Based 8-bit 200 MS/s Pipelined ADC", IEEE Journal of Solid-State Circuits, vol. 42, No. 12, Dec. 2007, pp. 2677-2687.

Huang, Hai, "High-Speed and Low-Power Pipelined SAR ADCS With Passive Residue Transfer and Dynamic Amplifier", the University of Texas at Dallas, May 2017, 75 pages.

Ali et al., "A 16-bit 250-MS/s IF Sampling Pipelined ADC With Background Calibration", IEEE Journal of Solid-State Circuits, vol. 45, No. 12, Dec. 2010, pp. 2602-2612.

Chae et al., "A 6.3 µW 20 bit Incremental Zoom-ADC with 6 ppm INL and 1 µV Offset", IEEE Journal of Solid-State Circuits, vol. 48, No. 12, Dec. 2013, pp. 3019-3027.

Devarajan et al., "A 12b 10GS/s Interleaved Pipeline ADC in 28nm CMOS Technology", ISSCC 2017, Session 16/Gigahertz Data Converters/16.7, 2 pages.

Fiorenza et al., "Comparator-Based Switched-Capacitor Circuits for Scaled CMOS Technologies", IEEE Journal of Solid-State Circuits, vol. 41, No. 12, Dec. 2006, pp. 2658-2668.

Huang et al., "A Non-Interleaved 12-b 330-MS/s Pipelined-SAR ADC With PVT-Stabilized Dynamic Amplifier Achieving Sub-1-dB SNDR Variation", ISSCC 2017, Session 28/ Hybrid ADCs/28.4, 2 pages.

Jiang et al., "A 7.6mW 1GS/s 60dB SNDR Single-Channel SAR-Assisted Pipelined ADC with Temperature-Compensated Dynamic Gm-R-Based Amplifier", ISSCC 2019/ Session 3/ Nyquist Rate ADCs/ 3.2, 2 pages.

Kull et al., "28.5 A 10b 1.5GS/s pipelined-SAR ADC with background second-stage common-mode regulation and offset calibration in 14nm CMOS FinFET", ISCC 2017/ Session 28/ Hybird ADCs/ 28.5, 2 pages.

Liu et al., "A 12-bit, 45-MS/s, 3-mW Redundant Successive-Approximation-Register Analog-to-Digital Converter With Digital Calibration", IEEE Journal of Solid-State Circuits, vol. 46, No. 11, Nov. 2011, pp. 2661-2672.

Ramkaj et al., "A 5GS/s 158.6mW 12b Passive-Sampling $8^x$-Interleaved Hybrid ADC with 9.4 ENOB and 160.5dB FoMS in 28nm CMOS", ISSCC 2019/Session 3/Nyquist Rate ADCs/3.3, 2 pages.

Straayer et al., "A 4GS/s Time-Interleaved RF ADC in 65nm CMOS with 4GHz Input Bandwidth", ISSCC 2016/Session 27/Hybird and Nyquist Data Converters/27.5, 2 pages.

Vaz et al., "A 13b 4GS/s Digitally Assisted Dynamic 3-stage Asynchronous Pipelined-SAR ADC", ISSCC 2017/Session 16/Gigahertz Data Converters/16.1, 2 pages.

Wulff et al., "CBSC pipelined ADC with comparator preset, and comparator delay compensation", 2009 NORCHIP, 2009, 4 pages.

Zhang et al., "A 0.6V 13b 20MS/s Two- Step TDC-Assisted SAR ADC with PVT Tracking and Speed-Enhanced Techniques", ISSCC 2019/Session 3/ Nyquist Rate ADCs/ 3.5, 2 pages.

* cited by examiner

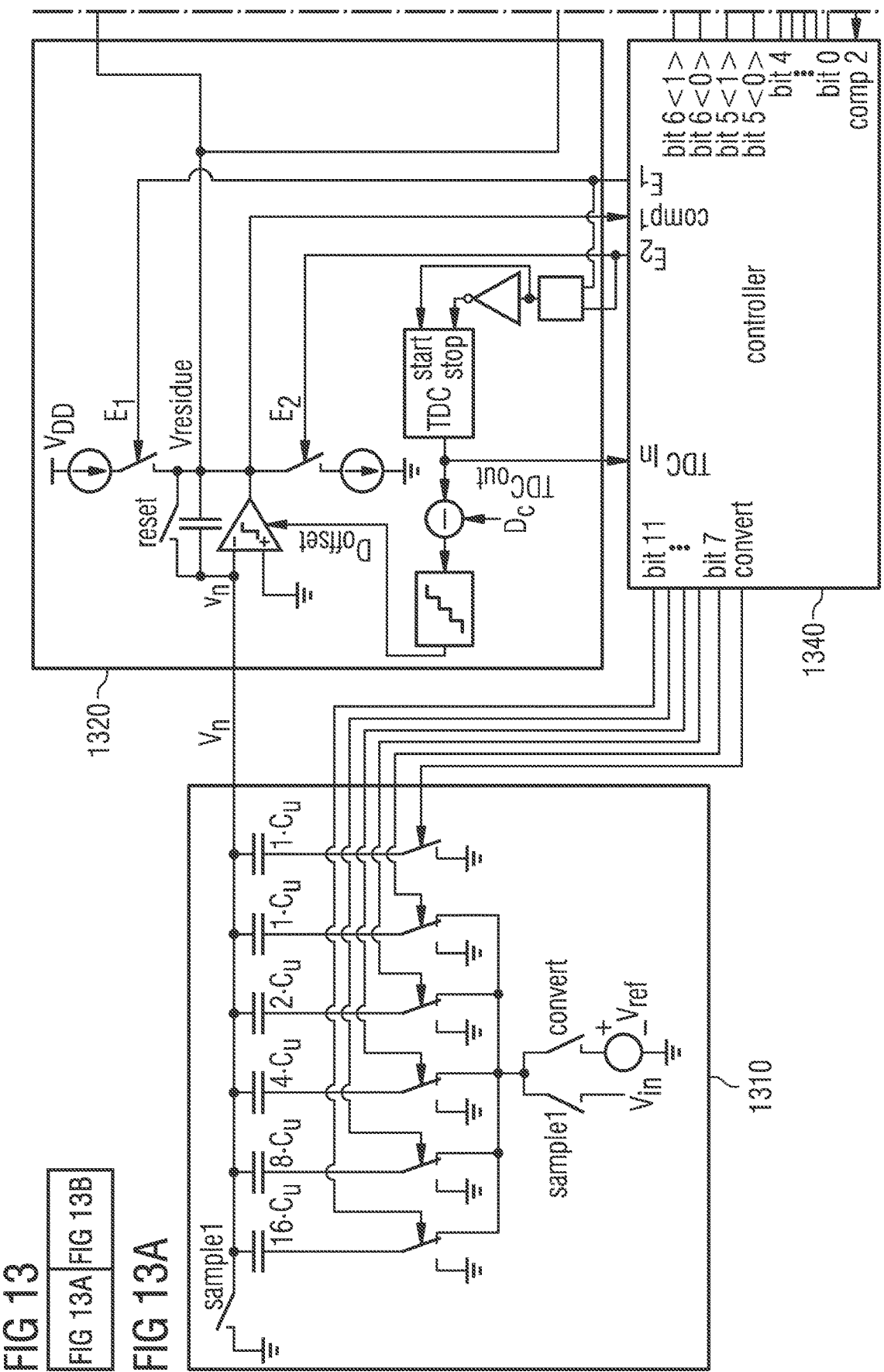

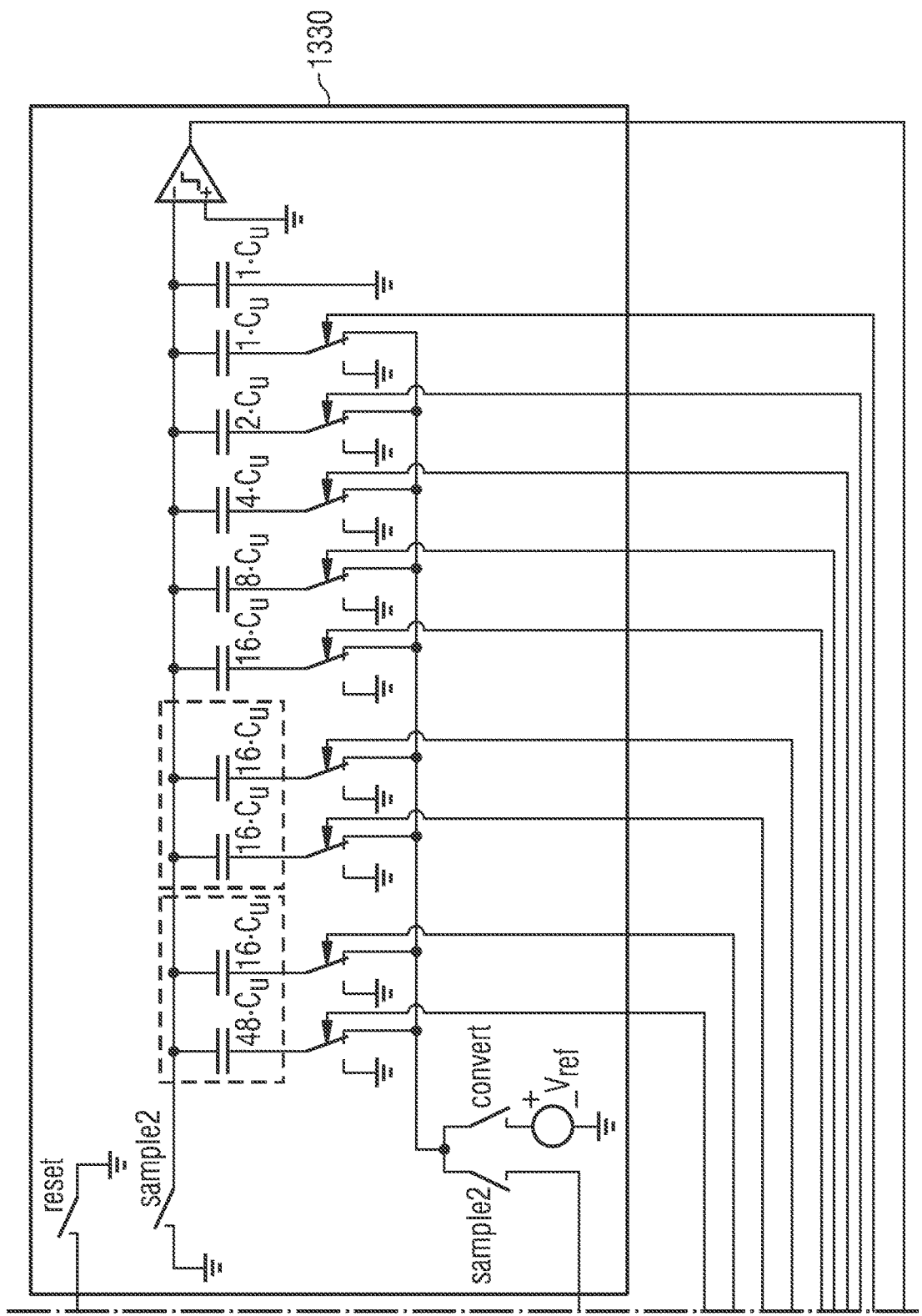

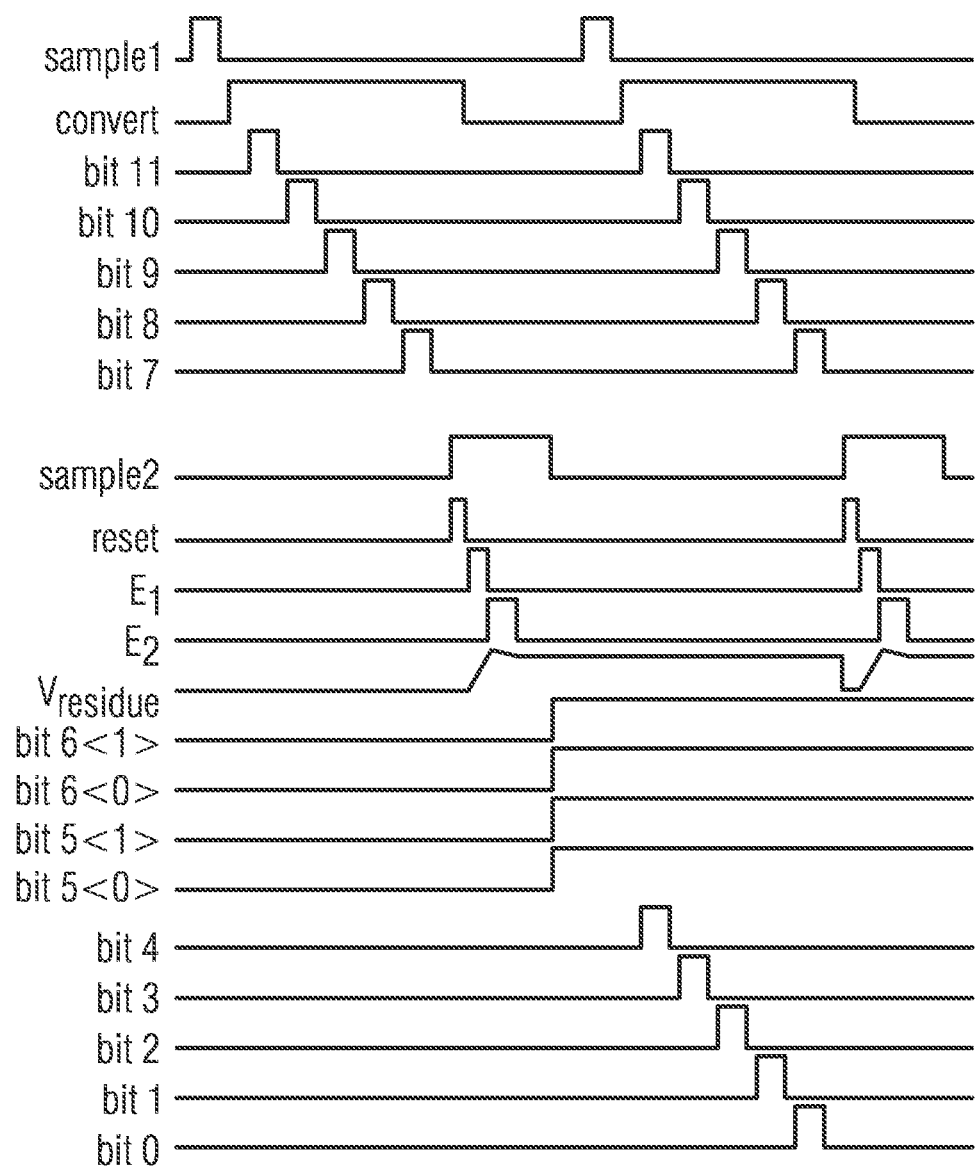

SWITCHED-CAPACITOR AMPLIFIER AND PIPELINED ANALOG-TO-DIGITAL CONVERTER COMPRISING THE SAME

CROSS-REFERENCE TO RELATED APPLICATIONS

The present application is the national stage entry of International Patent Application No. PCT/EP2020/082503, filed on Nov. 18, 2020, and published as WO 2021/104960 A1 on Jun. 3, 2021, which claims the benefit of priority of European Patent Application No. 19211524.4, filed on Nov. 26, 2019, all of which are incorporated by reference herein in their entireties.

TECHNICAL FIELD

The present disclosure relates to a switched-capacitor amplifier. Specifically, the present disclosure relates to a switched-capacitor amplifier that comprises a comparator coupled to sample and amplification capacitors, wherein the sample capacitor is charged and discharged by corresponding switches in dependence on an output signal of the comparator. The present disclosure relates also to a pipelined analog-to-digital converter that comprises at least two converter stages including analog-to-digital converters, digital-to-analog converters, subtractors and a switched-capacitor amplifier to amplify a residue signal.

BACKGROUND

Signal amplifiers are widely used in electronic devices to amplify an electronic signal. Analog amplifier concepts may use a transconductance amplifier that integrates a $g_m$ current on a capacitor for a fixed time. However, such analog concepts may be subject to variations of the manufacturing process, the supply voltage and the operating temperature (PVT—process, voltage, temperature) so that the gain can spread over PVT causing non-linearity problems. This requires calibration of the amplifier which is a time-consuming and costly process.

There are switched-capacitor amplifier concepts based on a comparator, wherein the input signal is transferred on a sample capacitor and charge is removed therefrom until the component detects the virtual ground node approaching the reference voltage of the comparator which may be ground potential. The comparator exhibits a switching delay until the detected transition at the input side appears at the output side. Therefore, a comparator-based switched capacitor amplifier includes a coarse current source to discharge the sample capacitor and a fine current source to recharge the sample capacitor thereafter to reduce the error due to charge overshoot caused by the comparator delay. However, the recharge phase may take a considerably long time due to the relatively low charging current which slows down the operation of a conventional comparator-based capacitor amplifier. The comparator may have an adjustable threshold to reduce the overshoot, however, this requires the comparator delay to be known over PVT, which is difficult or almost impossible.

Comparator-based switched-capacitor amplifiers may be used in pipelined analog-to-digital converters (ADCs) to amplify the residue signal of a previous stage to full scale to forward it to the next stage. Among the various types of ADC concepts, one possible class of ADCs to be used in the stages of a pipelined ADC may employ a successive approximation register algorithm.

There is a need to increase the operating speed of a comparator-based switched-capacitor amplifier to increase the conversion speed of an ADC such as a pipelined ADC as the conversion speed of the ADC is substantially determined by the operating speed of the residue amplifier. Furthermore, there is a need to prevent PVT variations from affecting speed and accuracy of the amplifier to increase the accuracy of a pipelined ADC using a comparator-based switched-capacitor residue amplifier.

It is an object of the present disclosure to provide a comparator-based switched-capacitor amplifier which operates faster.

It is another object of the present disclosure to provide a comparator-based switched-capacitor amplifier that is less dependent on variations of the manufacturing process and variations of operating conditions such as supply voltage and temperature.

It is yet another object of the present disclosure to provide a pipelined analog-to-digital converter that operates faster at higher accuracy.

SUMMARY

One or more of the above-mentioned objects are achieved by a switched-capacitor amplifier comprising the features of present claim 1.

According to an embodiment, a comparator-based switched-capacitor amplifier comprises a comparator having one or more input terminals and an output terminal. A sample capacitor is coupled to one of the input terminals through a switch. An amplification capacitor is also coupled to the input terminal of the comparator and to a current source to discharge the sample capacitor as well as to a current source to charge the sample capacitor through corresponding switches. The charge current source delivers a current that is smaller than the current of the discharge current source. A controller is configured to operate the switches in dependence on an output signal of the comparator. A load capacitor may be coupled to the amplification capacitor to store the amplified output charge, wherein the ratio of capacitances of amplification and sample capacitors determines the amplification factor of the amplification process. The amplifier may have single ended configuration or differential configuration.

According to the principles of the present disclosure, a closed loop control circuit is provided that closes a loop from the output of the comparator to an input of the comparator. The closed loop control circuit is configured to determine the delay of the comparator and control or determine an offset of the comparator in response to the determined delay. The closed loop control circuit can be included in the single ended as well as the differential configuration.

The closed loop control circuit allows a dynamic control of the comparator offset such that the comparator delay is substantially reduced or compensated. As a result, the signal overshoot of the discharging of the sample capacitor beyond the reference signal of the comparator such as ground potential after the detection of a virtual ground condition is substantially reduced or close to zero. Thereafter, the charging time of the sample capacitor through the charge current source until the detection of the next virtual ground condition is short. The control loop ensures that the overshooting at sample capacitor discharging is small and the subsequent sample capacitor charging is short so that the amplification operation of the switched capacitor amplifier is fast. The closed loop control circuit operates iteratively and dynamically to keep the overshoot as small as possible in the steady state phase. Thereby the regulation loop also compensates the PVT dependent parameters of the involved electronic components so that the amplification speed is substantially independent of PVT variations. A calibration during device test, for example, using a measurement of parameters to fuse or trim components within the amplifier as may be the case with conventional amplifiers, is not necessary in this regard. In addition, post calibration drift is inherently avoided.

The amplifier operates digitally to amplify an analog input signal using comparator, switches, capacitors and current sources. The amplification factor of the amplifier is mainly determined by the ratio between the capacitances of the amplification capacitor over the sample capacitor. All these components can be easily scaled to smaller feature sizes so that the amplifier design is scalable. Therefore, it is straightforward to transfer the verified design and dimensioning of an amplifier according to the principles of the present disclosure to a new process using smaller feature sizes by scaling while it can be expected that the performance is maintained. This is an important benefit for the use of the amplifier in larger systems such as analog-to-digital converters. Also the robustness of the amplifier against PVT variations is maintained.

According to embodiments, the closed loop control circuit may use digital components and may operate mainly digitally. The closed loop control circuit may comprise a time-to-digital converter (TDC) to determine a signal that is dependent on the comparator delay wherein the information of the signal is returned and fed back to the comparator to set an offset of the comparator. The digital embodiment using a TDC converter is highly PVT robust. The TDC may determine the charge time of the sample capacitor during the fine charge phase, because the time is representative of the comparator delay, as the charge time depends on the amount of overshoot which depends on the comparator delay. The TDC may determine a digital signal for the time from the start of the fine charge phase until the end of the fine charge phase which is determined by the comparator in response to the detection of a virtual ground condition. The TDC may use a fixed preset signal which is slightly above zero to enable negative feedback values when the TDC output may be zero. This may happen for positive initial comparator offsets when the fine charge phase is deactivated immediately after start. Accordingly, negative feedback values in the closed loop control circuit help to move out of the corresponding dead zone. The digital preset signal subtracting from the signal dependent on the delay of the comparator enables negative feedback values when the TDC output is zero or larger than zero for bidirectional comparator offset tuning. After the feedback loop has accumulated a high enough control signal assuming, for example, an integrator within the loop to push the comparator offset into the negative range, the loop may continue to operate with the preset signal being lowered or set to zero or close to zero in order to allow further fine tuning of the comparator offset. The digital preset signal may be set to zero once the loop has converged and is in a converged state or is in steady state. The to be integrated signal is a linear signal so that the control loop operates in linear fashion, is stabilized and provides zero error.

An integrator may be connected between the time-to-digital converter and the input terminal of the comparator. The integrator may be a digitally operating integrator such as a discrete time integrator. The discrete time integrator may also be realized as an accumulator. Alternatively, a digital gain block may be employed. The integrator shapes the time signal to close the control loop and enable setting of the offset of the comparator. The offset of the comparator may be set in various ways known to a skilled artisan, for example, through the reference input of the comparator or through an auxiliary terminal of the comparator that allows setting of the offset.

The comparator may comprise a first input terminal that is to be connected to the sample capacitor and the amplification or feedback capacitor. A second input terminal of the comparator may have the function of a reference input which may be connected to a reference potential such as ground potential. The first input terminal of the comparator may be the negative input terminal and the second input terminal may be the positive input terminal of the comparator. Also other configurations where the first input terminal is the positive input and the second input terminal is the negative input are useful. A controller operates the switches through which the discharging and charging of the sample capacitor takes place. The controller may be configured to cause the discharging of the sample capacitor until the comparator detects a virtual ground condition and to cause the charging of the sample capacitor until the comparator detects another virtual ground condition.

According to embodiments, the comparator may comprise a preamplifier stage at the input side of the comparator that enables the setting of the offset by adding a current in dependence on the signal delivered from the closed loop control circuit. The preamplifier stage of the comparator may be a differential preamplifier having first and second branches. A digital-to-analog converter may be controlled in response to the determined delay of the comparator in that it is controlled by the digital signal output from the integrator. The digital-to-analog converter generates a current in dependence on the signal supplied by the closed loop control circuit which is applied or added to one of the branches of the differential preamplifier stage of the comparator. One of the branches may be adjusted through a digital-to-analog converter by a negative feedback signal, the other one of the branches may be adjusted through another digital-to-analog converter by a positive feedback signal. Various possibilities are conceivable for the digital-to-analog converters to generate a current in response to a digital signal such as the digital signal output from the integrator.

The time-to-digital converter (TDC) may comprise a chain of delay circuits. The chain may have an input to receive a start signal that propagates through the stages of the delay circuit. The start signal may represent the beginning of the charging of the sample capacitor. An impulse that enters the chain propagates through the chain and the location of the impulse in the chain when the virtual ground condition is met will be read out and encoded to generate a digital output signal of the TDC. The virtual ground condition is communicated to the TDC with a corresponding stop impulse. The output signal of the TDC is representative of the charging time of the sample capacitor which is a measure for the delay of the comparator.

In an embodiment, one or more or all of the delay stages of the delay chain may comprise current starved inverters wherein current source transistors are connected between a CMOS inverter and supply potential terminals. The current through the inverter in the transitional switching phase of the inverter is limited by the current source transistors so that the transitional switching operation is delayed and the inverter employs a defined delay. Another inverter is connected downstream of the current starved inverter to shape the output signal and adapt the polarity. The current source transistors of the current starved inverter may be portions of current mirrors that are supplied with a bias current to limit the current of the current starved inverter to the supply potential rails.

According to yet another embodiment, the closed loop control circuit may be realized as an analog control loop. In this regard, the closed loop control circuit may comprise a capacitor that is charged in dependence on the delay of the comparator. Charging of the capacitor can be performed in parallel to and simultaneously with the charging of the sample capacitor which is indicative of the delay of the comparator. The signal determined by the capacitor from the closed control loop may be shaped and forwarded to the comparator to set its offset.

The analog closed loop control circuit may comprise a subtractor to subtract a reference signal from the delay dependent signal. An integrator connected downstream of the subtractor may integrate the output signal from the subtractor and forward the integrated signal to an input terminal of the comparator to generate an offset of the comparator. The offset may be generated in that the output of the integrator is connected to the reference input of the comparator or to an auxiliary terminal of the integrator to set the comparator offset. An amplifier may be used instead of an integrator. The analog comparator delay compensation control loop involves an active circuit element such as the subtractor. Although the active circuit element can be subject to PVT variations, the dynamic operation of the control loop is still able to compensate the comparator delay.

The switched-capacitor amplifier may be realized in a differential configuration. In the differential configuration, another sample capacitor may be connected to another input terminal of the comparator through a switch and another amplification capacitor may be connected to the other input of the comparator to generate a symmetric circuit shape allowing differential operation of the circuit. The charge and discharge current sources are connected between the amplification capacitors to allow charging and discharging of the sample capacitors. Alternatively to the use of corresponding sample capacitors connected to each one of the input terminals of the comparator, one sample can be connected differentially between the input terminals of the comparator.

The switched-capacitor amplifier as explained above can be used in a pipelined analog-to-digital converter (ADC) to amplify the residue signal from a previous stage to a full strength signal to be forwarded to the subsequent stage. A pipelined ADC may comprise at least two or more converter stages. The converter stages are serially connected with each other. At least one or more of the converter stages comprise a terminal for an input signal for the analog signal to be converted, an analog-to-digital converter connected to the input terminal and a digital-to-analog converter connected downstream of the analog-to-digital converter. A subtractor performs a subtraction between the analog input signal and the analog reconverted signal from the DAC. The switched-capacitor amplifier is connected to an output terminal of the subtractor to amplify a residue signal supplied by the subtractor. The output signal of the amplifier is forwarded to the input terminal of the next stage. The next stage may be another stage having the same structure as explained above or a final stage of the pipelined ADC including a single ADC.

In a pipelined ADC, the switched-capacitor amplifier for the amplification of the residue signal provides a speed and power bottleneck and is crucial for the accuracy of the conversion. The use of a switched-capacitor amplifier according to the principles of this disclosure improves the operational speed of the ADC by minimizing the delay by offset compensation. The offset compensation is performed in a closed control loop so that it is PVT robust. The capacitance ratio between amplification and sample capacitors determines the amplification factor. This capacitor ratio is easily reproducable so that it ensures accuracy. Furthermore, it is scalable so that the amplifier design can be reused in other manufacturing processes and in other technical applications.

The analog-to-digital converters in one or more of the converter stages may be successive approximation register (SAR) ADCs. The SAR ADCs each comprise a plurality of capacitors to convert the most significant bits in the previous stage and convert a number of least significant bits in the subsequent following stage or stages. The switched-capacitor amplifier according to the principles of the present disclosure is connected between an output of the previous stage and an input of the following stage, thereby amplifying the residue signal provided by the previous stage. In a SAR ADC concept, the comparator of the residue amplifier can be used in multiple functions, including the comparator-based switched capacitor amplification of the residue signal and as a comparator in the SAR algorithm since both operations are performed at different time instants.

According to an embodiment of a pipelined ADC, the time-to-digital converter of the digital closed loop control circuit of the switched-capacitor amplifier can be used also to determine the time to discharge the sample capacitor. This time is indicative of the range of the analog signal so that the TDC output signal can be forwarded to the following converter stage to set a zoom range at the following converter stage. Specifically, the TDC detects the time during discharging of the sample capacitor until a virtual ground condition is detected including the comparator delay. The TDC output signal is forwarded to the downstream connected following stage to preset at least a subset of the capacitors in the following stage in dependence on the determined discharge time that is the output signal of the TDC. Presetting the most significant capacitors of the following stage has the effect of setting a zoom range for the residue conversion made by the following stage. The TDC in the digital closed loop control circuit can thereby be reused to enhance the conversion speed in a pipelined ADC concept.

According to a further embodiment, the accuracy of the pipelined ADC can be enhanced by matching reference signals with each other. According to the SAR concept, the capacitors of a SAR ADC are supplied alternately with a reference voltage potential and the to-be-sampled analog input signal. A circuit may be used to correlate that reference voltage potential and the charging and discharging currents in the switched-capacitor amplifier with each other. The correlation circuit may generate a reference current out of the reference voltage potential and current mirror circuits may be used to generate the charging and discharging currents for the switched-capacitor amplifier from the reference current.

In an embodiment, the corresponding circuit may include a transistor, an ohmic resistor connected between the source terminal of the transistor and ground terminal and a control loop including an error amplifier. The drain terminal of the transistor sinks the reference current from which the charging and discharging currents are derived. The error amplifier takes the signal from the resistor and compares it to the reference voltage also applied to the SAR converter capacitors. The error amplifier provides a regulation so that the reference current is directly related to the reference voltage. The ohmic resistor is substantially temperature-invariant so that the correlation between reference voltage and reference current is temperature-stable. The error amplifier may be offset compensated to further increase correlation accuracy. In the case of scaling the reference current generating circuit, it is usually possible to predictably scale the ohmic resistor to maintain proper correlation of reference voltage and reference currents.

It is to be understood that both the foregoing general description and the following detailed description are merely exemplary, and are intended to provide an overview or framework to understand the nature and character of the claims. The accompanying drawings are included to provide a further understanding and are incorporated in, and constitute a part of, this description. The drawings illustrate one or more embodiments, and together with the description serve to explain principles and operation of the various embodiments. The same elements in different figures of the drawings are denoted by the same reference signs.

BRIEF DESCRIPTION OF THE DRAWINGS

In the drawings:

FIG. 13 shows a detailed diagram of a pipelined SAR ADC using zoom ranges;

FIG. 14 shows a waveform diagram of signals and voltages from the circuit of FIG. 13;

DETAILED DESCRIPTION OF THE EMBODIMENTS

The present disclosure will now be described more fully hereinafter with reference to the accompanying drawings showing embodiments of the disclosure. The disclosure may, however, be embodied in many different forms and should not be construed as limited to the embodiments set forth herein. Rather, these embodiments are provided so that the disclosure will fully convey the scope of the disclosure to those skilled in the art. The drawings are not necessarily drawn to scale but are configured to clearly illustrate the disclosure.

Figure 1:
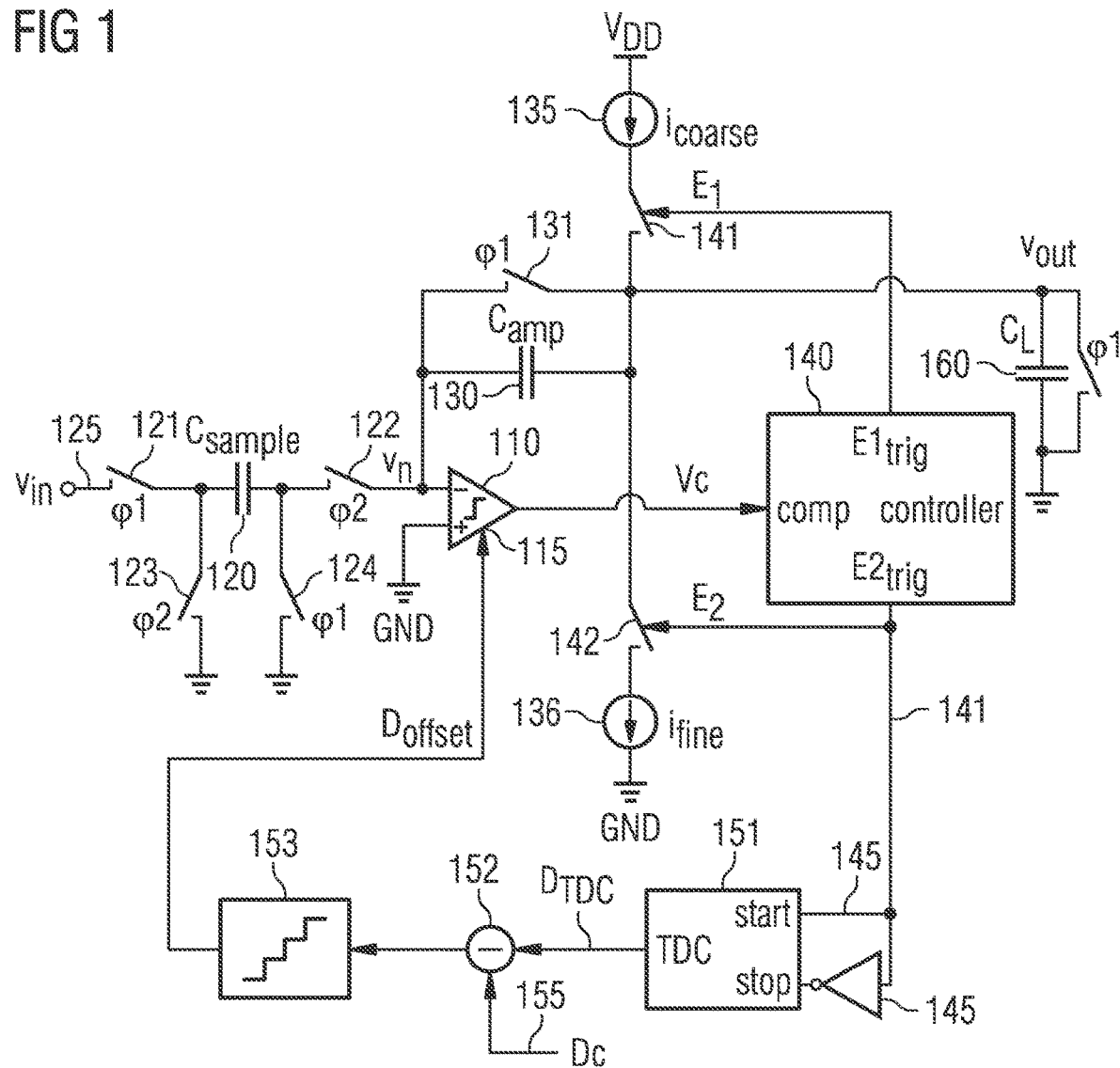
FIG. 1 shows a comparator-based switched-capacitor amplifier according to the principles of the present disclosure using a digital closed control loop circuit.

FIG. 1 shows a block diagram of a comparator-based switched-capacitor amplifier. The amplifier comprises a comparator 110 as a central component of which an input terminal is coupled to a sample capacitor 120 and an amplification capacitor 130. Specifically, a terminal of the sample capacitor 120 is switchably connected to the input terminal of the comparator 110. A switch 122 is connected between the terminal of the sample capacitor 120 and the input terminal of the sample capacitor 120. A terminal of the amplification capacitor 130 is connected to the input terminal of the comparator 110. The terminal of the amplification capacitor 130 is also connected to the switch 122 which is connected to the terminal of the sample capacitor 120. An output terminal of comparator 110 is coupled to a controller 140 which generates control signals E1 and E2 that operate switches 141, 142. Switch 141 is connected in series with a current source 135 which is connected to the positive supply potential VDD. Switch 142 is connected in series with a current source 136 which is connected to ground potential GND. The current sources 135, 136 and the corresponding switches 141, 142 are connected to a terminal of the amplification capacitor 130. A load capacitor 160 is connected to the node between current sources 135, 136 and the amplification capacitor 130. The load capacitor represents the capacitive load CL connected to the output of the amplifier.

Several switches are provided to operate the amplifier and perform the switched-capacitor operation. A terminal of sample capacitor 120 can be alternately connected to the input terminal 125 supplied with the to-be-amplified input voltage vin and ground potential through corresponding switches 121 and 123, respectively. Another terminal of sample capacitor 120 can be alternately connected to one of the input terminals of comparator 110 and ground potential through corresponding switches 122 and 124, respectively. The switches are operated by non-overlapping clock signals cp1, cp2. In the circuit shown in FIG. 1, the negative input terminal "−" of the comparator 110 is connected to the sample and amplification capacitors 120, 130, while the positive input terminal "+" is connected to ground potential GND. It is also possible to reverse the polarization and connect the positive input to capacitors 120, 130 and the negative input to ground potential. The amplifier shown in FIG. 1 is of a single ended configuration, wherein the input signal is supplied by a sample capacitor 120 connected in single ended fashion.

During operation, the sample capacitor 120 is charged with the input voltage vin, and the amplification capacitor 130 and the load capacitor 160 are short-circuited and discharged during the active phase of signal cp1. Then, the sample capacitor is disconnected from the input terminal 125 and connected between ground potential and the input terminal of the comparator 110 during the active phase of signal cp2. The first control signal E1 is active to close switch 141 and discharge sample capacitor 120 through amplification capacitor 130. As shown in the waveform diagram of FIG. 2, the voltage vn at the negative input node "−" of comparator 110 rises by supplying current icoarse from current source 135 until the comparator detects a virtual ground condition 210. At virtual ground, the input voltage vn at the negative input of comparator 110 equals the voltage at the positive input of comparator 110 which is ground potential GND as shown at 210 in FIG. 2. Charge is removed from the sample capacitor 120 by current icoarse from current source 141 until the comparator detects virtual ground vn approaching GND. As the discharge current passes through the feedback capacitor 130, the voltage on the sample capacitor 120 appears amplified by the ratio of the capacitances of capacitors 130, 120, Csample/Camp. Therefore, the gain is ideally only dependent on the capacitor ratio. However, in practice the comparator delay results in an overshoot 211 of the input voltage vn at the negative input terminal of comparator 110.

Figure 2:
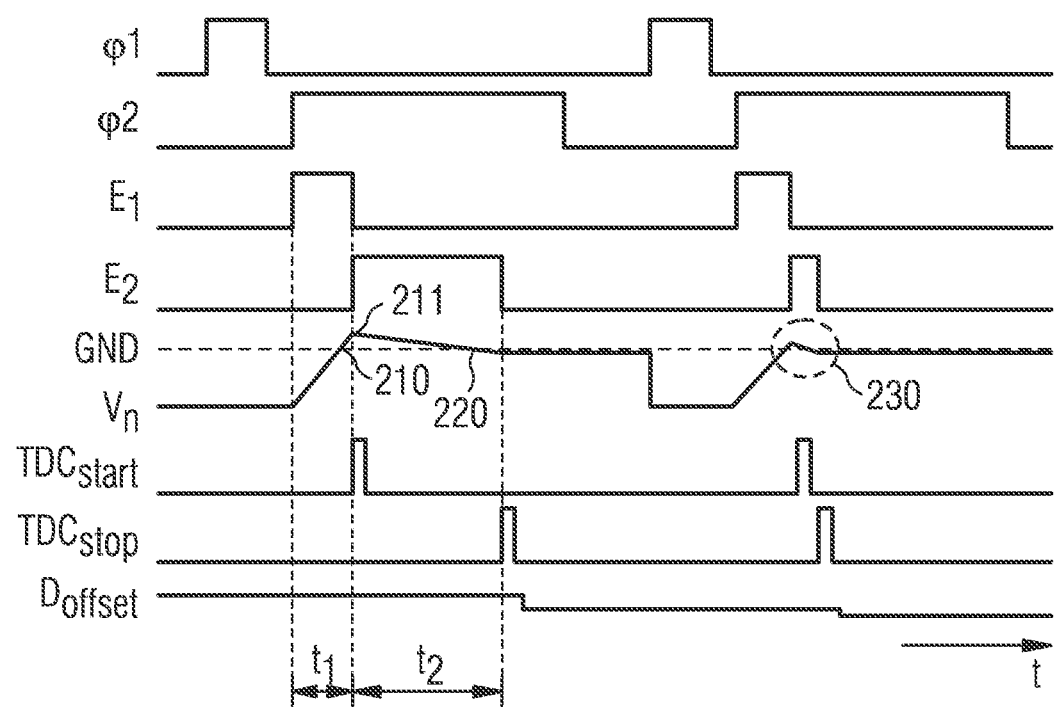
FIG. 2 shows a waveform diagram of signals and voltages from the amplifier of FIG. 1.

Then, the fast coarse discharge phase by signal E1 is followed by a second fine charge phase of the second control signal E2 generated by the controller 140 employing a lower charging current ifine which results in another virtual ground condition 220 of the input voltage vn at the negative input of comparator 110. There may be another small overshoot at virtual ground point 220, however, since the current is relatively low, this overshoot is negligible. The second fine current phase when the second control signal E2 is active can consume a considerable amount of time. As shown in FIG. 2, the duration t2 of the fine charge phase is about three times the duration t1 of the coarse discharge phase. Signals E1, E2 are supplied by controller 140 in response to the voltage Vc at the output terminal of comparator 110. During the discharge phase, switch 141 is closed supplying current icoarse from discharge current source 135, while switch 142 is open. During the fine charge phase, switch 142 is closed supplying current ifine through current source 136, while switch 141 is open.

According to the principles of the present disclosure, a closed control loop is provided to compensate the overshoot and thereby reduce the phase of fine charging of the sample capacitor. The closed loop control circuit is connected between the output 141 of controller 140 and input terminal 115 of comparator 110. The closed loop control circuit generates a signal Doffset to control the offset of the comparator 110. The control loop operates repetitively and drives the overshoot as close as possible to zero. As can be seen at region 230 shown in FIG. 2, the overshoot is much less at the next performance of a charging/discharging phase. Correspondingly, the signal Doffset supplied to input 115 of comparator 110 decreases with increasing operation time. In steady state, the charging phase with the fine current ifine is much shorter, speeding up the amplification operation. The closed loop control circuit operates dynamically and regulates the offset of the comparator 110 each time the amplification circuit of FIG. 1 is started. Accordingly, any inherent variations of the circuit caused by variations of the manufacturing process of the switched-capacitor amplifier circuit or any variations caused by variations of the supply voltage VDD or variations generated by other ambient conditions such as temperature, so-called PVT variations, are dynamically reduced as close as possible to zero by the closed loop control circuit.

The closed loop control circuit includes a time-to-digital converter (TDC) 151 which measures the time t2 of the control signal E2 which is representative of the fine charge phase during which the fine charge current ifine of current source 136 is supplied through the closed phase of switch 142. The time-to-digital converter 151 generates an output signal DTDC which is a digital representation of that time period. This time period corresponds to the delay of the comparator 110 which is the propagation time from the detection of a virtual ground condition at its inputs to the setting of a corresponding output signal Vc at the comparator output. An integrator 153 is connected downstream to the TDC 151 and integrates the digital signal DTDC to an offset control signal Doffset to be supplied to terminal 115 of comparator 110. The integrator 153 may be a digital integrator. Alternatively, instead of a digital integrator 153, a digital gain block can be employed as well. Furthermore, a subtractor 152 may be supplied between TDC 151 and integrator 153 to subtract a constant signal Dc at terminal 155 from the digital time information DTDC. The digital signal Dc is set slightly above zero to enable positive feedback values when the TDC output signal DTDC is zero. This happens for positive initial comparator offsets when the fine phase is deactivated immediately after start. Therefore, enabling negative feedback values helps to move out of this dead zone. The subtractor 152 and the digital preset signal Dc enable negative feedback values for bidirectional comparator offset tuning. The bidirectional control loop is thereby stabilized. It is therefore guaranteed that the output signal of the TDC 151 is always at least zero or greater than zero. The digital signal Dc is injected in the loop to enable positive feedback values. This may be the case when the TDC output is zero. The digital signal Dc is set to zero once the loop has converged. This leaves an overshoot which is zero and enables a linear control loop in which a linear signal is integrated, wherein the control loop is stabilzed and provides zero error.

Figure 3:
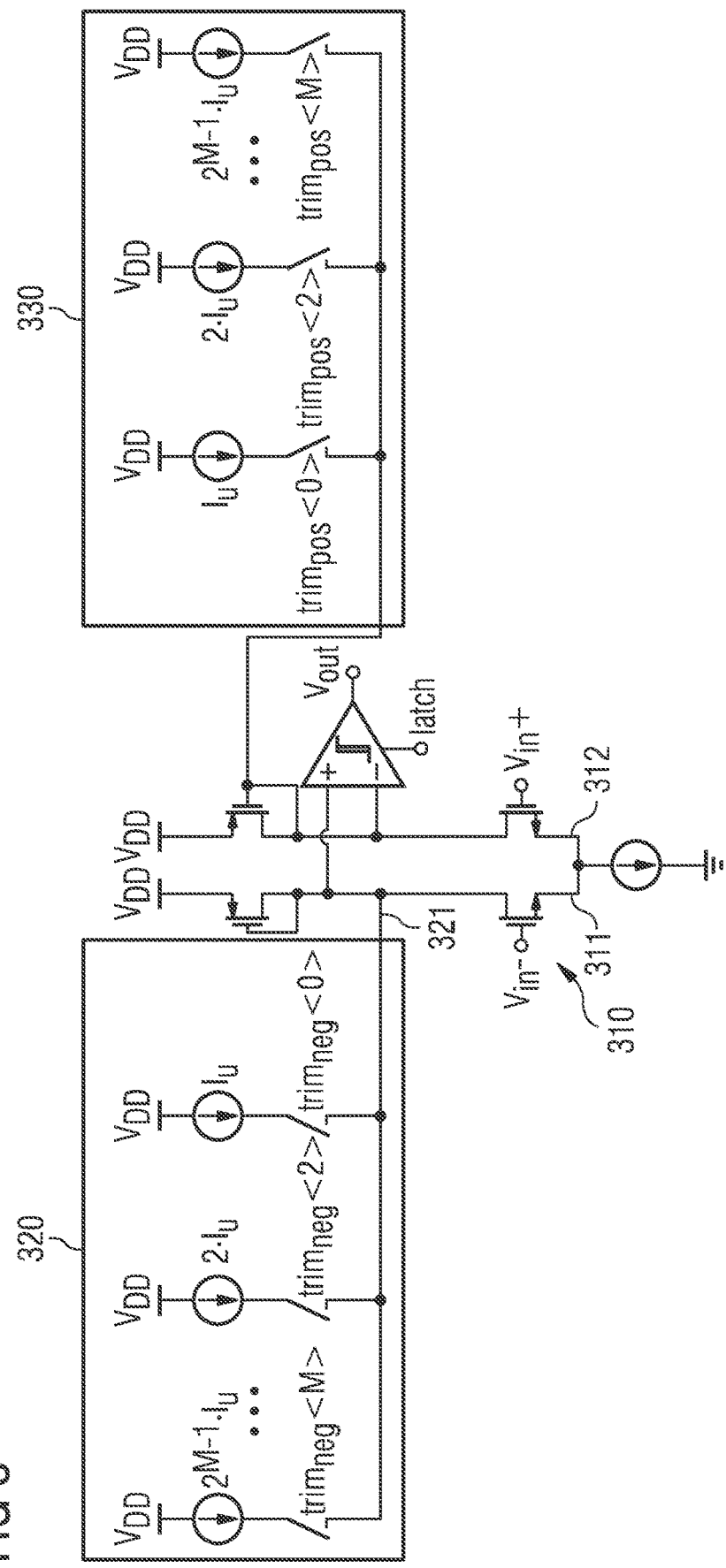
FIG. 3 shows a circuit to set the offset of the comparator of the amplifier of FIG. 1.

FIG. 3 shows an embodiment of comparator 110 detailing a preamplifier stage and a digital-to-analog converter (DAC) for each one of the branches of the differential preamplifier stage to set the offset of the preamplifier. The DACs are controlled by signal Doffset which depends on the time signal DTDC provided by the TDC 151, convert the signal to a corresponding current which is applied to one of the branches. The applied current inserts an asymmetry into the differential preamplifier stage resulting in an offset. The closed control loop causes the offset in such a way that the delay of the comparator is substantially compensated.

In more detail, FIG. 3 shows the preamplifier stage 310 having negative branch 311 and positive branch 312 of the differential preamplifier stage. A digital-to-analog converter 320 generates a current at terminal 321 which is added to the current through branch 311. DAC 320 receives negative values of the signal Doffset, whereas a corresponding DAC 330 adds a corresponding current to the positive branch 312, when the signal Doffset has positive values. Many possibilities of a current generating DAC are conceivable. FIG. 3 depicts one example of a DAC which comprises a series of binary weighted currents IU, 2 IU, . . . , $2^{M-1}$ IU. A switch is connected serially with each of the current sources wherein each switch is controlled by the digital value Doffset so that it contributes a binary weighted current at the output 321 of DAC 320 in dependence on the signals that control the switches. DAC 320 is used for negative digital control values, whereas DAC 330 has a corresponding structure wherein the switches are controlled by a positive digital control value. The digital code Doffset programs the offset of the comparator in distinct steps. As the comparator delay is input slope dependent, the offset compensation is performed based on the result from the coarse current phase, when the sample capacitor is discharged. During the fine current phase when the sample capacitor is charged, the required offset is different, but due to the slow charging, the impact of delay and offset is negligible.

Figure 4:
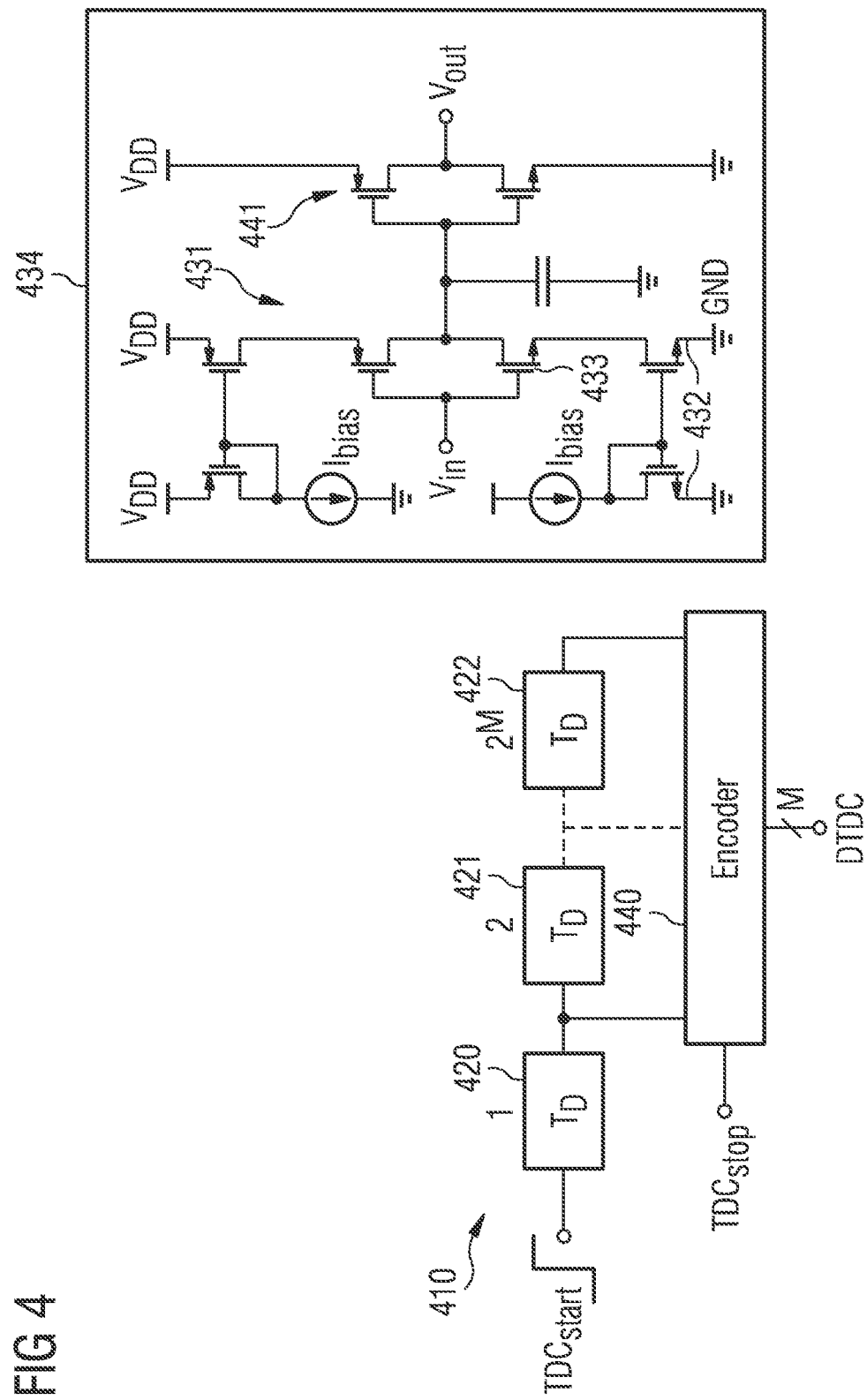
FIG. 4 shows a block diagram of a time-to-digital converter of the amplifier of FIG. 1 and a detailed circuit diagram of one of the delay stages.

FIG. 4 shows an example of a realization of a time-to-digital converter 151. The TDC receives a start impulse TDCstart in response to a (rising) edge of the control signal E2 generated in response to a switching of the output signal Vc of the comparator 110 generated in response to a virtual ground detection at comparator 110. The impulse TDCstart is generated in response to the beginning of the fine charging phase of the sample capacitor. The impulse TDCstart may be formed by an impulse forming circuit 145 receiving the control signal E2 forming an impulse when signal E2 has a rising or falling edge as shown in FIG. 1. The impulse TDCstart propagates through a delay chain 410 that comprises a serial connection of several, for example 2M delay circuits 420, 421, 422. Each delay circuit applies a delay of TD onto the propagating impulse. An impulse of a stop signal TDCstop triggers an encoder 440 connected to the output of each one of the delay circuits 420, . . . , 422 to freeze the current status of the propagating start impulse within the delay chain. The encoder 440 provides the digital output signal DTDC to be forwarded in the closed loop control circuit. The stop signal impulse TDCstop is generated in response to another (falling) edge of the control signal E2 generated in response to a switching of the output signal Vc of the comparator 110 generated in response to another virtual ground detection at comparator 110. The impulse TDCstop is generated in response to the end of the fine charging phase of the sample capacitor. The impulse TDCstop is generated in response to the end of the fine charging phase of the sample capacitor. The start impulse TDCstart propagates through the chain of delay circuits of the time-to-digital converter. Upon receipt of the stop impulse TDCstop, the output signal DTDC is generated. The output signal DTDC determines the current switch status of the chain of delay circuits which is given by the propagation state of the start impulse propagating therethrough which status is indicative of the time duration during which the stop impulse propagated through the chain of delay circuits. The output signal DTDC indicates the status of the chain of delay circuits at the instance of reception of the stop impulse. The output signal DTDC is a measure of and is indicative of the duration of the fine charge phase and thus a measure of the delay of the comparator.

In the present embodiment, the time-to-digital converter shown in FIG. 4 uses start and stop impulses TDCstart, TDCstop relating to the switching events of the comparator 110 indicated by the rising and falling edge of the second control signal E2 which determines the fine charging phase of the sample capacitor. This time period t2 is indicative and proportionally related to the switching delay of the comparator 110.

In the right-hand portion of FIG. 4, an example for the realization of one or more or all of the delay circuits 420, 421, 422 of the delay chain 410 is shown. The delay circuit includes a current starved inverter cell which includes a first current starved inverter 431 that includes current limiting transistors at either side of the supply voltage terminals. At the side of the ground potential GND, for example, a current mirror 432 is connected between the NMOS transistor 433 of the first inverter and the terminal for ground potential. The current mirror is controlled by a current Ibias which is mirrored into the supply path of the first inverter 431. A corresponding current mirror limiting the current to Ibias is provided in the path to the supply potential VDD of inverter 431. When the first inverter 431 is switched from high to low or low to high, the switching current is limited by current Ibias resulting in a delay of the switching operation. A second inverter 441 is connected downstream to the first inverter 431 to generate sharp edges and generate the proper polarity of the propagating impulse.

The delay circuits 420, 421, 422 of the delay chain 410 may be subject to considerable PVT variations as they are implemented as a dynamic circuit. However, this is not of concern for the present topology of the closed loop control circuit since the closed loop configuration drives the output signal DTDC of the time-to-digital converter to zero so that the operation of the controller does not rely on precise, absolute accuracy. It is sufficient that the effective step size of the delay chain remains within the stable range of the control loop which can be achieved by designing the delay chain and the control loop for sufficient margin. It is the effective loop convergence time which is subject to PVT spread of the time-to-digital converter which only effects the initial cycles after power-on of the circuit. Once the closed control loop has settled, the actual comparator-based amplifier performance is independent of the characteristics of the time-to-digital converter.

The comparator-based switched-capacitor amplifier shown in FIG. 1 and the digital closed loop control of which major components are shown in FIGS. 3 and 4 require only dynamic power consumption so that the power consumption in steady state is relatively low. The circuits operate fully digitally so that they are scalable to smaller processed feature sizes and smaller processed nodes. The closed loop control concept dynamically regulates the comparator delay to zero or almost zero. The control loop operates fully digitally so that no active gain dependent elements are included which allows that the circuit is easily scalable. The same circuit design can be used in a manufacturing process that has downscaled feature sizes wherein the correct functioning of the circuit is guaranteed.

Figure 5:
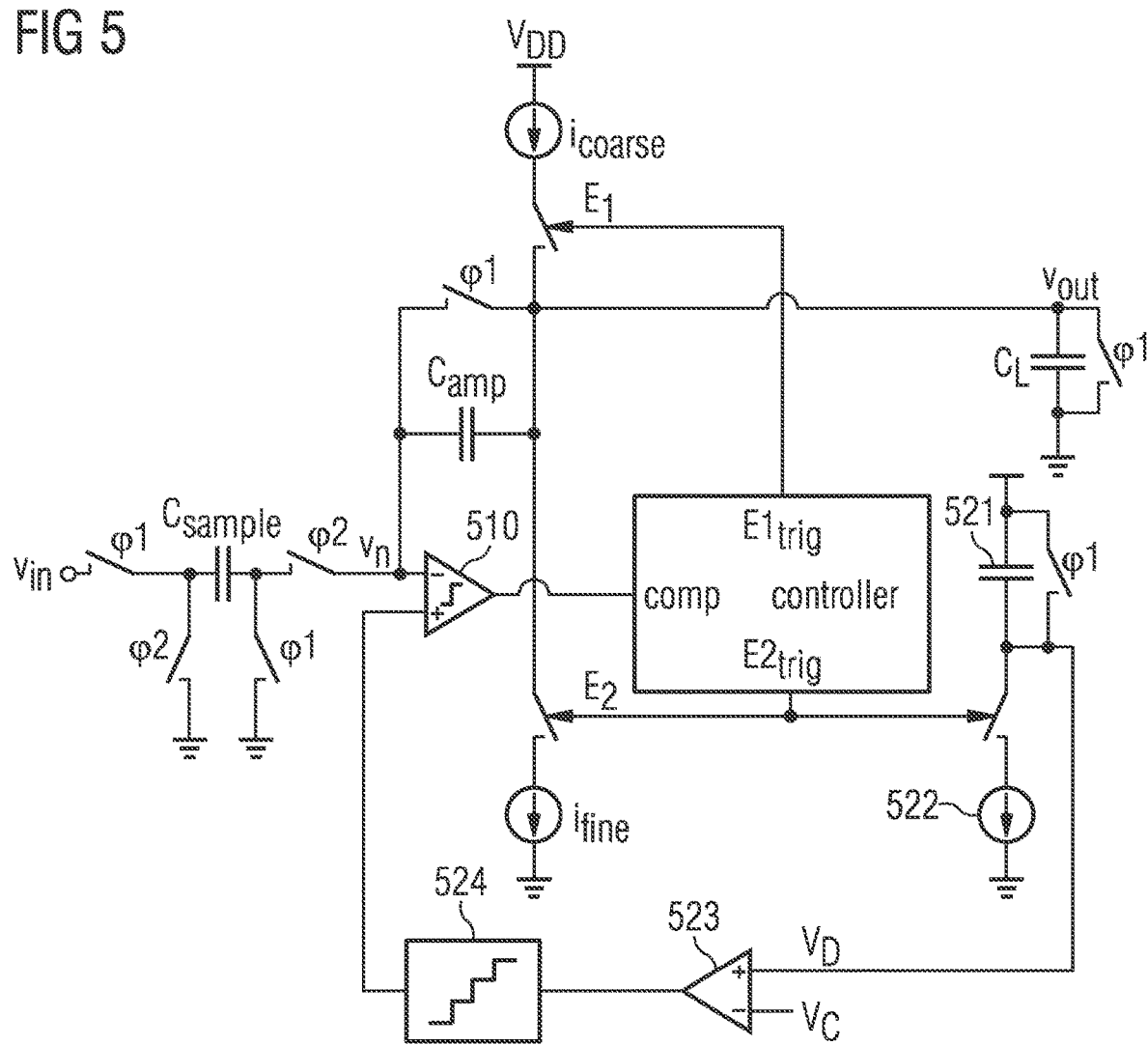
FIG. 5 shows another embodiment of a comparator-based switched-capacitor amplifier according to the principles of the present disclosure using an analog closed loop control circuit.

Turning now to FIG. 5, another closed loop control solution to compensate the comparator delay of a comparator-based switched-capacitor amplifier is shown which is alternative to the solution shown in FIG. 1. The circuit shown in FIG. 5 includes a delay capacitor 521 which is charged by current source 522 when the second control signal E2 is active. The information in voltage signal VD at capacitor 521 is forwarded to an input of the comparator 510 to control its offset. A subtractor 523 is provided which receives the voltage signal VD at its positive input. The negative input of subtractor 523 is supplied with a fixed voltage potential Vc. The function of the voltage Vc corresponds to the function of the digital preset signal Dc shown at terminal 155 of FIG. 1. An integrator 524 is connected between the output of subtractor 523 and the positive input of comparator 510. Subtractor 523 and integrator 524 are analog devices that may include active components so that these devices as such may be subject to PVT variations. However, the offset control of the comparator 510 is performed in a dynamic closed control loop so that the compensated switching delay of the comparator is independent from PVT variations in the steady state.

The offset control of the comparators 110, 510 can be made in different ways. The offset setting signal may be input through one of the positive and negative input terminals of the comparator or through an auxiliary input that causes a setting of the offset. One example for setting the offset in a digital case has been explained above in connection with FIG. 3.

Figure 6:
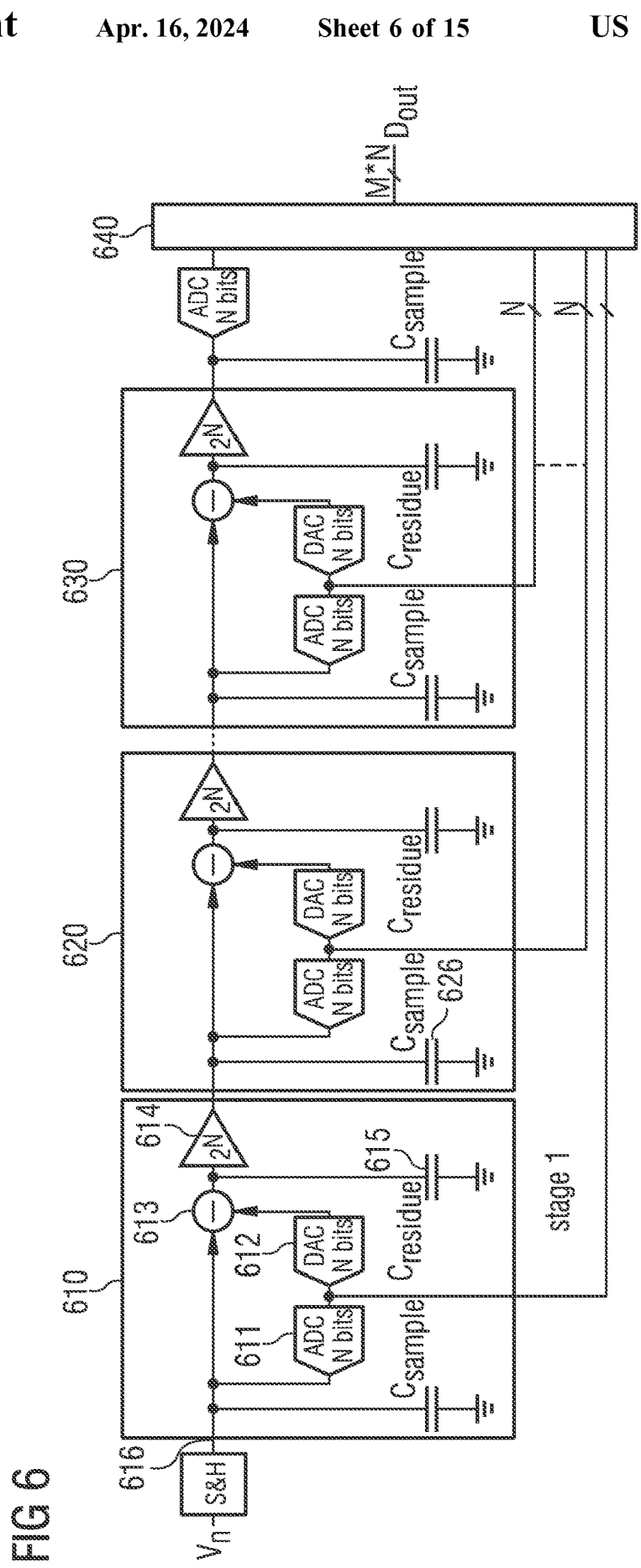
FIG. 6 shows a block diagram of a pipelined analog-to-digital converter.

The switched-capacitor amplifiers as shown in connection with FIGS. 1 and 5 may be used as a residue amplifier in connection with a pipelined analog-to-digital converter (ADC). A general example of a pipelined ADC is shown in FIG. 6. The pipelined ADC comprises several converter stages connected in serial fashion 610, 620, 630. Each one of the stages has substantially the same circuit structure as described in connection with stage 610. Stage 610 receives the analog input signal vin at terminal 616. A sample and hold (S&H) stage may be useful. The input signal is stored on a sample capacitor Csample and analog-to-digital converter 611 converts a subset of bits such as N bits into the digital domain. The N converted bits are forwarded to a combiner stage 640 common to all stages. The digital bits from ADC 611 are reconverted into the analog domain by digital-to-analog converter 612. The analog reconverted signal is subtracted from the analog input signal vin at subtractor 613. Accordingly, subtractor 613 is connected to the output of the DAC 612 and the input terminal 616. The output of subtractor 613 is connected to a capacitor 615 that stores the residue charge of that stage. The charge is converted to the full signal swing by a residue amplifier 614, which may be one of the amplifier embodiments explained above such as the comparator-based switched-capacitor amplifiers including the closed loop control circuit for compensating the comparator delay as shown in FIGS. 1 and 5.

The pipelined topology requires the amplification of the residue signal of the previous stage such as 610 to the full scale signal being an input signal to the consecutive stage such as 620. Stage 620 performs a conversion of another subset of M bits similar to the conversion described in connection with stage 610. All additional outputs of stages 610, 620, . . . , 630 are forwarded to combiner 640 which generates the complete converted digital signal. The previous stage can convert another next sample of the input signal while the consecutive stage is converting the previous sample of the input signal so that a pipelined operation takes place. In such a pipelined ADC, the residue amplifier such as amplifier 614 is a bottleneck for power consumption and conversion speed. Residue amplifiers according to the principles explained in connection with FIGS. 1 and 5 provide linear settling without comparator delay impacting accuracy and PVT robustness. The use of residue amplifiers according to the principles of the present disclosure speeds up the overall conversion time in a pipelined ADC without compromising PVT tolerance and accuracy.

Figure 7:
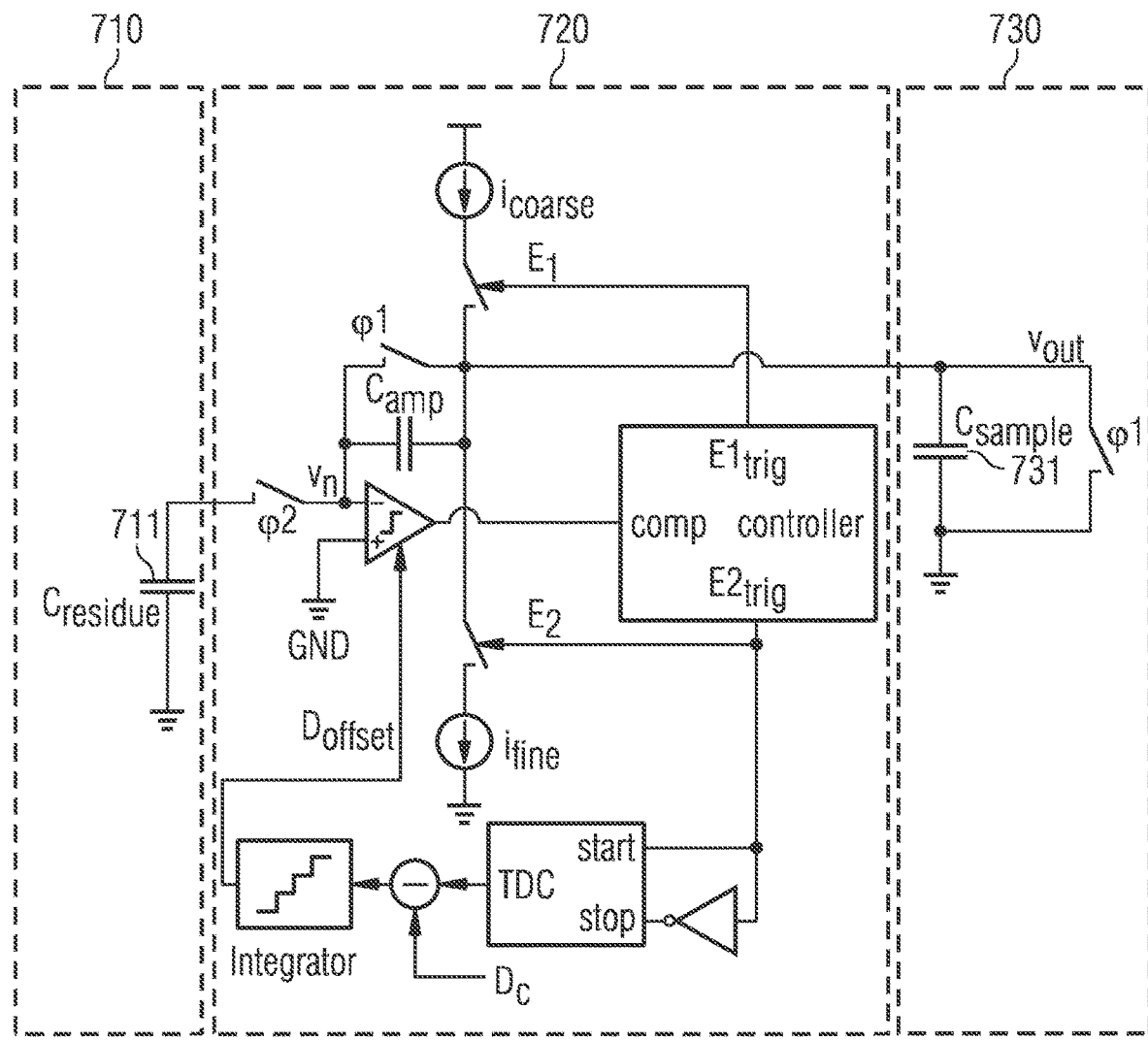
FIG. 7 shows a portion of the pipelined analog-to-digital converter of FIG. 6 detailing the comparator-based switched-capacitor amplifier and related circuit elements.

FIG. 7 shows the use of a comparator-based switched-capacitor amplifier as a residue amplifier in a pipelined ADC such as the ADC shown in FIG. 6. The residue signal of the previous stage 710 is stored in the residue capacitor 711 which acts as the sample capacitor for the comparator-based switched capacitor amplifier 720. The sampling capacitor 711 is the sum of all DAC capacitors that hold the residue charge. The output load capacitor of the amplifier 720 is the sample capacitor 731 of the next stage 730.

Figure 8:
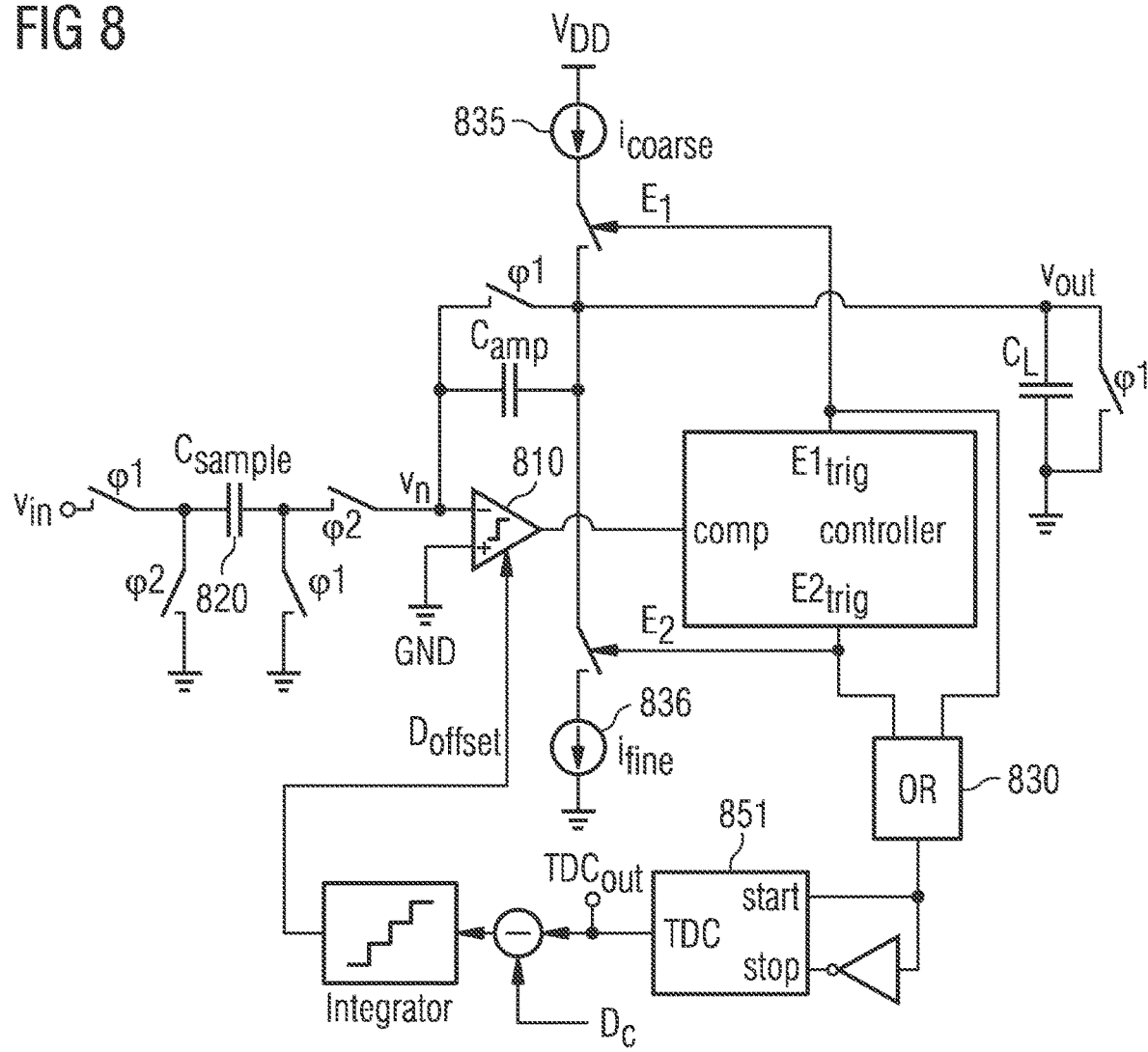
FIG. 8 shows an embodiment of the comparator-based switched-capacitor amplifier of FIG. 1 to be used in a successive approximation register pipelined analog-to-digital converter using zoom ranges.
Figure 9:
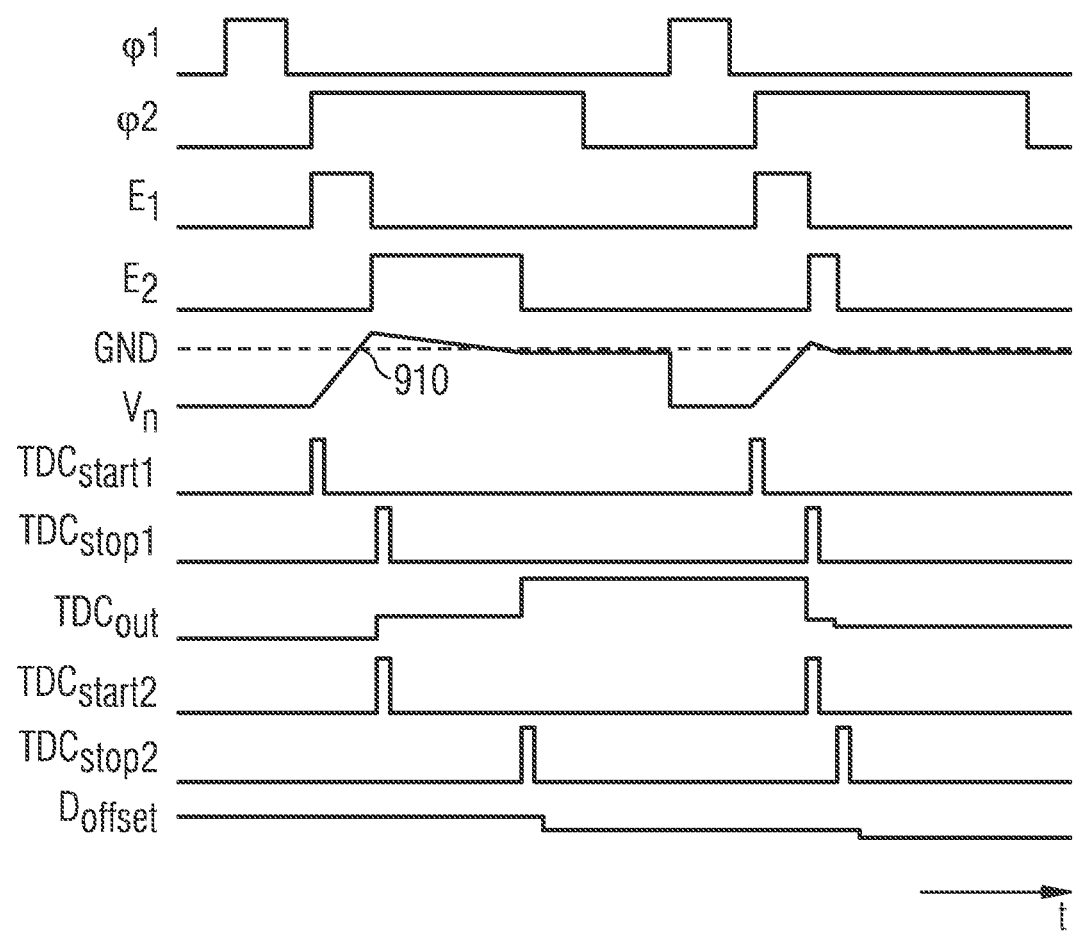
FIG. 9 shows a waveform diagram of signals and voltages from the amplifier of FIG. 8.

An embodiment of a comparator-based switched-capacitor amplifier useful for a pipelined ADC configuration is shown in FIG. 8. FIG. 8 depicts the comparator-based switched-capacitor amplifier of FIG. 1 having a digital closed loop control including the time-to-digital converter 851 further configured to determine the time to discharge the sample capacitor 820 through coarse current source icoarse during the active phase of the first control signal E1. The discharging time comprises the ramping of the input voltage vn of the comparator 810 until a virtual ground condition 910 is achieved including the comparator delay. The time for the discharging of the sample capacitor 820 is indicated by start and stop impulses TDCstart1, TDCstop1 by the TDC 851 (FIG. 9). An OR-gate 830 generates an OR-operation between the control signals E1, E2 so that both signals E1, E2 are forwarded to the TDC 851. The output signal of TDC 851 TDCout is used to set a zoom range of the consecutive stage such as stage 620 in the pipelined ADC, wherein the TDCout value is taken from the previous stage such as stage 610. As the sampling capacitor 820 is discharged by a constant current icoarse of coarse current source 835, the total discharge time is signal dependent. Accordingly, the discharge time contains information about the residue voltage. The discharge time measured by the TDC 851 is reused to convert the discharge time to digital. As the discharge time is signal-dependent, it can be used in the subsequent converter stage of the pipelined ADC to set a zoom range which is explained in more detail in connection with FIGS. 10 and 11.

Figure 10:
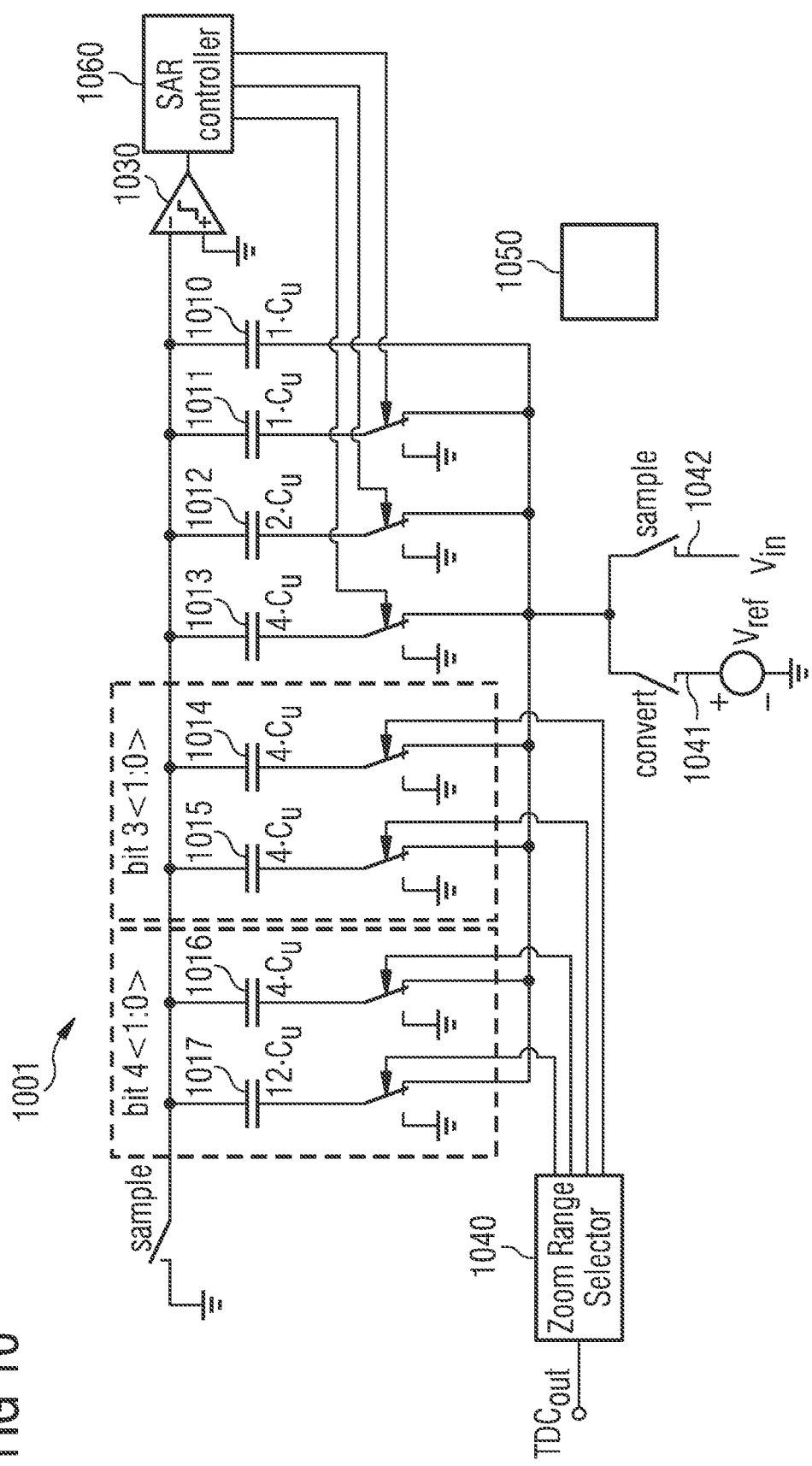
FIG. 10 shows a principle circuit diagram of a SAR ADC enabling the setting of zoom ranges.

FIG. 10 shows an embodiment of an analog-to-digital converter such as ADC 611 in one of the converter stages of a pipelined ADC. FIG. 10 shows a successive approximation register (SAR) ADC 1001 that performs an analog-to-digital conversion according to a successive approximation algorithm. The ADC comprises a number of capacitors such as capacitors 1010, 1011, 1012, 1013, 1014, 1015, 1016, 1017. The capacitors 1010, . . . , 1017 may have binary weighting, although other weighting principles are also possible. The capacitors are precharged with a reference voltage vref and, then, they are connected to the to-be-sampled voltage vin. Terminal 1041 supplies the reference voltage vref, terminal 1042 supplies the input voltage vin. A comparator 1030 makes a decision for a successive approximation algorithm performed by SAR controller 1060.

In accordance with the principles of the present disclosure, a zoom range selector 1040 is supplied with the output signal TDCout from the TDC 851 shown in FIG. 8. The signal TDCout is representative of the discharging time of the discharge operation of the sample capacitor 820 through coarse current source 835 as explained in connection with FIGS. 8 and 9. The zoom range selector 1040 presets a charge into one or more of the zoom capacitors 1014, 1015, 1016, 1017. In the example shown in FIG. 10, four zoom bits bit 4[1:0], bit 3[1:0] are used.

Figure 11:
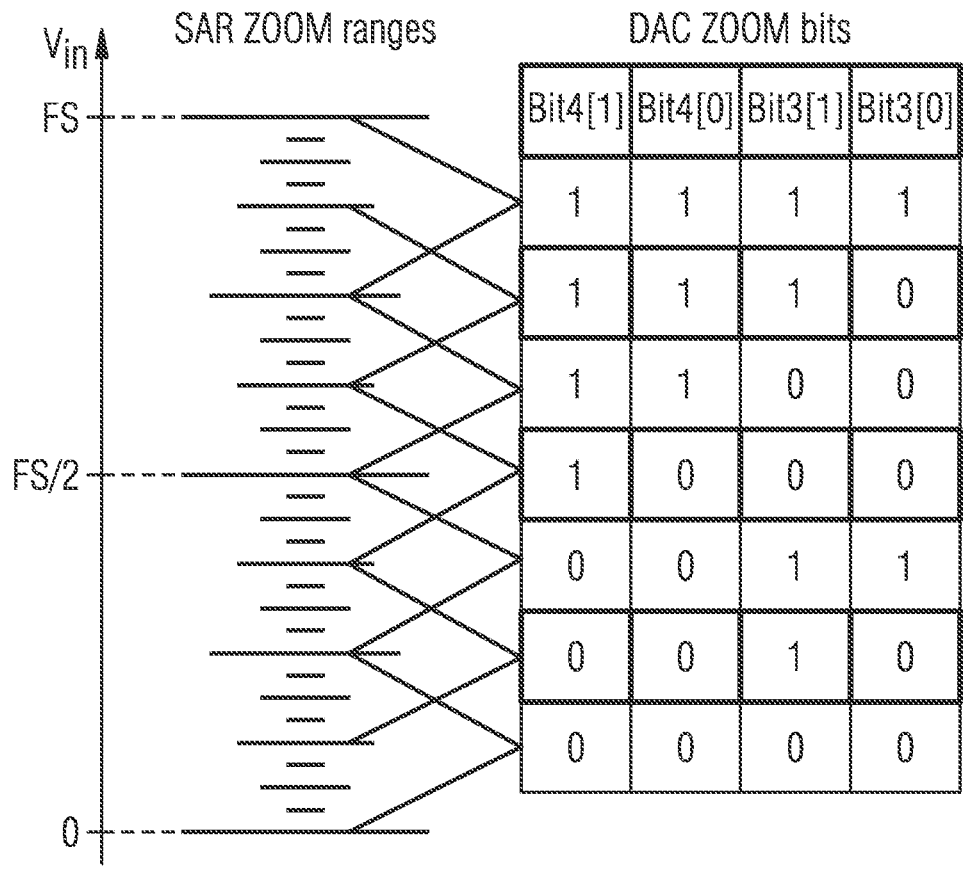
FIG. 11 shows a concept to employ SAR zoom ranges in the circuit of FIG. 10.

FIG. 11 shows the ranges that are related to the four zoom bits. In the present example, seven combinations of the zoom bits are used to distinguish seven zoom ranges. Using zoom bits and setting zoom range allows to cover a range above and below the estimate provided by the output signal TDCout of the TDC 851. This provides an error tolerance without the need for more conversion cycles. The use of zoom bits is particularly useful when the ADCs in the pipelined ADC have SAR configuration. The TDC range spread for zoom bits generated by the output of the time-to-digital converter is subject to tolerance. To achieve the required tolerance, the currents of the current sources used in the amplifier circuit should be related to the reference voltage used for the SAR sampling process. A circuit 1050 to achieve the necessary tolerance between the reference voltage vref supplied at terminal 1041 to the sampling capacitors alternately to the to-be-sampled input voltage vin at terminal 1042, is to be related to the coarse and fine currents icoarse, ifine for the discharging and the charging current sources 835, 836.

Figure 12:
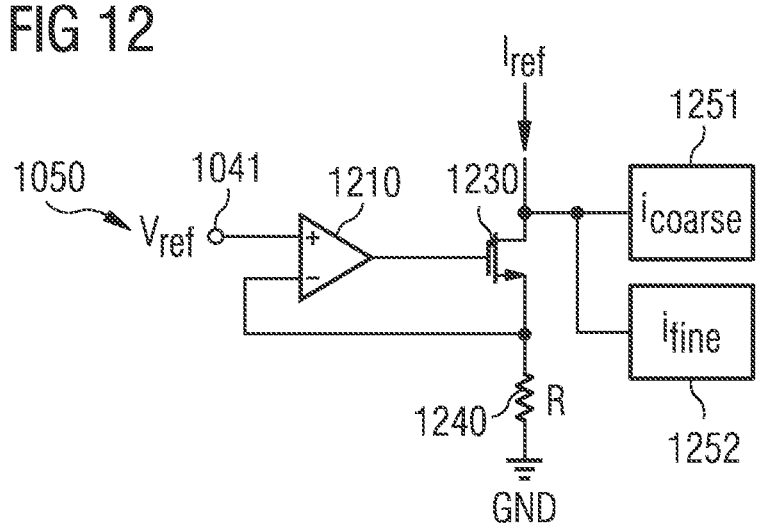
FIG. 12 shows a circuit to generate currents correlated to a reference voltage.

FIG. 12 shows a correlation circuit 1050 to enable a correlation between voltage vref and currents icoarse, ifine. The circuit comprises a MOS transistor 1230 of which the source terminal is connected to ground potential GND through an ohmic resistor 1240. The voltage at the resistor 1240 is fed back to an error amplifier 1210 which determines the difference between the voltage at resistor 1240 and the reference voltage vref from terminal 1041. The output of the error amplifier 1210 controls the gate terminal of transistor 1230. The reference current iref at the drain terminal of MOS transistor 1230 is tightly related to the reference voltage vref. The currents to be used in the switched-capacitor amplifier such as coarse and fine current sources 135, 136, 835, 836 are generated from reference current iref through corresponding current mirrors 1251, 1252. Circuit 1050 uses an ohmic resistor 1240 which as such is subject to PVT variations. However, design and manufacturing of an ohmic resistor is well controllable process. When scaling the circuit to smaller feature sizes, it is also easy to redesign the resistor 1240, if necessary, in a predictable way so that the circuit shown in FIG. 12 is also scalable in a predictable way despite including active components and PVT-related components such as resistor 1240.

FIGS. 13 and 14 show a two-stage pipelined analog-to-digital converter using a comparator-based switched-capacitor amplifier according to the principles of the present disclosure as a residue amplifier. FIG. 13 shows the circuit structure and FIG. 14 shows the waveforms of relevant signals of the circuit of FIG. 13. The ADC uses a SAR architecture to generate an output signal of 12 bits [bit 0 . . . bit 11]. A first stage 1310 converts the five most significant bits (MSBs) while the second stage 1330 converts the amplified residue from the first stage with a resolution of seven least significat bits (LSBs). The residue amplifier 1320 is connected between first and second stages 1310, 1330 and receives the output signal vn from the first stage 1310 to amplify it to the full range Vresidue to be forwarded and sampled by the subsequent stage 1330. A controller 1340 generates the control signals to perform proper first and second stage operations, the switched capacitor operation of the amplifier and the collection of the converted digital bits.

The controller is configured to perform zoom range detection and zoom range control in connection with the TDC of the residue amplifier 1320 and the zoom range capacitors of the second stage 1330. The TDC of the offset control loop of the switched capacitor amplifier 1320 is reused to generate an output signal TDCout indicative of the discharge time of the sample capacitor from the first stage 1310. The discharging time is the time duration between the beginning of the discharging of the sample capacitor to the reaching of the virtual ground condition plus the comparator delay as indicated by the active phase of signal E1 between impulses TDCstart1 to TDCstop1. This TDCout value obtained from the first stage 1310 is used to set the zoom range capacitors of the second stage 1330 to represent four bits such as bit 5[1:0], bit 6[1:0]. The first stage 1310 may be operatively connected to the residue amplifier 1320 in a first step. The second stage 1330 may be operatively connected to the residue amplifier 1320 in a subsequent second step, wherein the zoom range is set in response to the TDCout value obtained when the first stage 1310 was connected to the residue amplifier 1320.

The circuit shown in FIG. 13 has an increased operating speed since the comparator-based switched-capacitor amplifier 1320 uses a closed loop control for offset compensation to reduce the overshooting in response to comparator delay. The circuit operates fully digitally so that the circuit is straightforwardly scalable for different feature sizes of a CMOS manufacturing process. The circuit uses zoom bits enabled by the time-to-digital converter in the digital closed control loop for the offset compensation of the comparator of the amplifier which achieves error tolerance without the need for more conversion cycles in that it allows to cover a range above and below the estimate for the range obtained by the determination of the discharging time by the TDC. The amplifier operates fully digitally so that it is PVT tolerant and more robust to PVT variation. The gain of the amplifier can be relatively exactly set by the ratio of the amplification and sample capacitors. The residue amplifier enables high speed, scalability and PVT tolerance. A zoom range detection for a second stage of a pipelined SAR ADC enables higher resolution for the same conversion time without significant circuit overhead.

Figure 15:
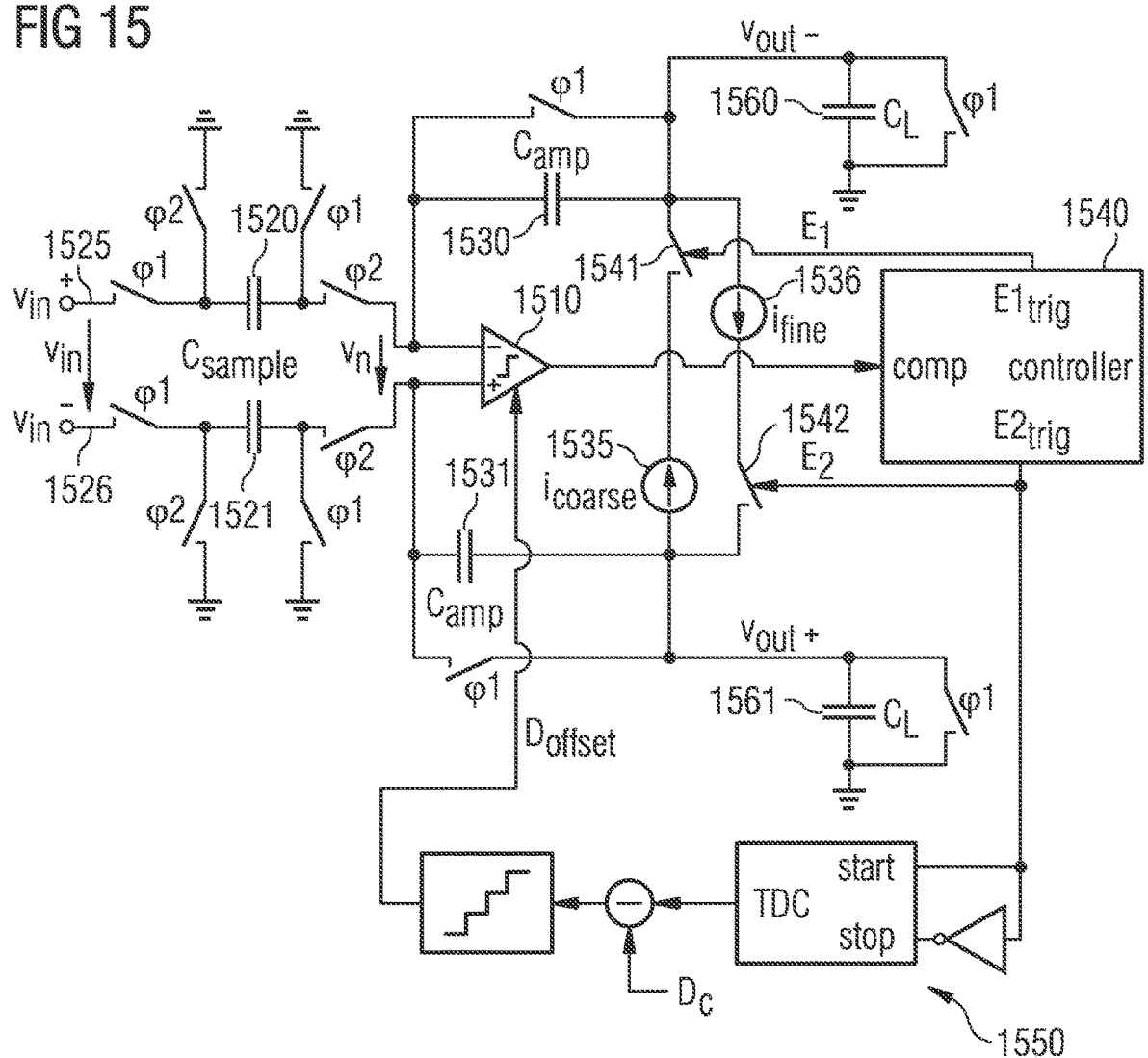
FIG. 15 shows a comparator-based switched-capacitor amplifier according to the principles of the present disclosure in differential configuration using a digital closed control loop circuit.

FIG. 15 shows a differential configuration of a comparator-based switched-capacitor amplifier. The circuit comprises a first amplification capacitor 1530 connected to the negative input terminal "−" of the comparator 1510 and a second amplification capacitor 1531 connected to the positive input terminal "+" of the comparator 1510. The coarse discharge current source 1535 as well as the fine charge current source 1536 are connected between the first and second amplification capacitors 1530, 1531 together with corresponding switches 1541, 1542 operated by the control signals E1, E2, respectively, generated by controller 1540 in response to the output signal from the comparator 1510. Current sources 1535 and 1541 generate currents of different strength with different, opposite orientation. The output signal is the differential signal between the first load capacitor 1560 and a second load capacitor 1561, each connected to one of the amplification capacitors. At the input side, the differential input signal Vin is supplied between positive and negative input terminals 1525, 1526 which are each connected to corresponding sample capacitors 1520, 1521 through corresponding switches. The sample capacitors are connected to the positive and negative input terminals of the comparator through corresponding switches. Furthermore, each terminal of the sample capacitors is connected to ground potential terminals through corresponding switches which are operated alternately. Control signals cp1, cp2 cause a charging of the sample capacitors with the differential input signal during the active phase of switch control signal cp1 and cause connection to the input terminals of the comparator 1510 and charge transfer during the active phase of control signal cp2.

The closed loop control circuit 1550 of the differential amplifier circuit of FIG. 15 is the same as the closed loop control circuit in the single-ended case of the circuit of FIG. 1. Also the timing diagram of the single-ended amplifier circuit shown in FIG. 2 applies correspondingly to the operation of the differential circuit of FIG. 15.

Figure 16:
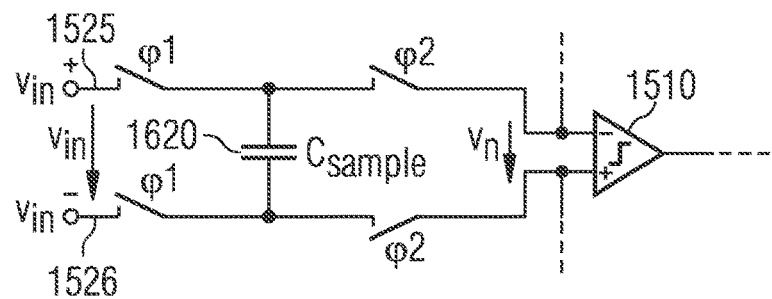
FIG. 16 shows a single sample capacitor to be used in the differential configuration of the comparator-based switched-capacitor amplifier.

FIG. 16 shows the input portion of a differential comparator-based switched capacitor amplifier, wherein a single sample capacitor 1620 is used instead of two sample capacitors such as capacitors 1520, 1521 in the circuit of FIG. 15. Sample capacitor 1620 is connected between the positive and negative input terminals of comparator 1510 through corresponding switches. Other switches are provided that connect the terminals of sample capacitor 1620 to the terminals 1525, 1526 of the differential input voltage Vin. The switches connecting the sample capacitor 1620 either to the terminals of the input voltage Vin or to the input terminals of the comparator are operated alternately by control signals cp1, cp2.

It will be apparent to those skilled in the art that various modifications and variations can be made without departing from the spirit or scope of the disclosure as laid down in the appended claims. Since modifications, combinations, subcombinations and variations of the disclosed embodiments incorporating the spirit and substance of the disclosure may occur to the persons skilled in the art, the disclosure should be construed to include everything within the scope of the appended claims.

The invention claimed is:

1. A switched-capacitor amplifier, comprising:

a comparator having input terminals and an output terminal;

a sample capacitor coupled to one of the input terminals;

an amplification capacitor coupled to the one of the input terminals and through a first switch to a discharge current source and through a second switch to a charge current source;

a controller configured to operate the first and second switches in dependence on an output signal of the comparator; and a closed loop control circuit configured to determine a delay of the comparator and control an offset of the comparator in response to the determined delay, wherein the closed loop control circuit comprises a time-to-digital converter to determine a signal dependent on the delay of the comparator, wherein the signal is fed back to the comparator to set an offset of the comparator, and wherein the closed loop control circuit further comprises an integrator connected between the time-to-digital converter and the comparator.

2. The switched-capacitor amplifier of claim 1, wherein the closed loop control circuit further comprises a terminal to preset a signal that is subtracted from the signal dependent on the delay of the comparator.

3. The switched-capacitor amplifier of claim 2, wherein the preset signal that is subtracted from the signal dependent on the delay of the comparator is preset to zero when the closed loop control circuit is in a converged state.

4. The switched-capacitor amplifier of claim 1, wherein the comparator comprises another input terminal which is configured to be operatively supplied with a reference potential, the controller is configured to cause a discharging of the sample capacitor until the comparator detects a virtual ground condition and the controller is configured to cause a charging of the sample capacitor until the comparator detects another virtual ground condition.

5. The switched-capacitor amplifier of claim 1, wherein the comparator comprises a differential preamplifier stage and at least one digital-to-analog converter which is controlled in dependence on the signal dependent on the delay of the comparator and convert it to a current signal which is applied to one of the branches of the differential preamplifier stage.

6. The switched-capacitor amplifier of claim 1, wherein the time-to-digital converter comprises a chain of delay circuits, the chain configured to operatively receive a start signal in response to the beginning of the charging of the sample capacitor.

7. The switched-capacitor amplifier of claim 4, wherein the time-to-digital converter comprises a chain of delay circuits and is configured to receive a start impulse in response to the detection of the virtual ground condition by the comparator and to receive a stop impulse in response to the detection of the other virtual ground condition by the comparator, wherein the time-to-digital converter is further configured to let the start impulse propagate through the chain of delay circuits and generate an output signal in response to the reception of the stop impulse indicative of the status of the chain of the delay circuits.

8. The switched-capacitor amplifier of claim 6, wherein each one of the delay circuits comprises a first current starved inverter and current source transistors connected between the first inverter and supply potential terminals and a second inverter connected downstream to the first inverter.

9. The switched-capacitor amplifier of claim 1, wherein the closed loop control circuit comprises a capacitor to be charged in dependence on the delay of the comparator to generate a signal dependent on the delay of the comparator, wherein the signal is fed back to the comparator to set an offset of the comparator.

10. The switched-capacitor amplifier of claim 9, wherein the closed loop control circuit further comprises a subtractor to subtract a reference signal from the signal dependent on the delay of the comparator and an integrator connected downstream to the subtractor, wherein an output of the integrator is connected to another input terminal of the comparator to generate an offset of the comparator.

11. The switched-capacitor amplifier of 1, further comprising another amplification capacitor coupled to another one of the input terminals of the comparator, wherein the discharge current source and the charge current source are connected between the amplification capacitor and the other amplification capacitor and wherein the sample capacitor or another sample capacitor is coupled to the other one of the input terminals of the comparator.

12. A pipelined analog-to-digital converter comprising at least two converter stages serially connected with each other, at least one of the converter stages comprising:

an input terminal for an analog input signal;

an analog-to-digital converter connected to the input terminal and a digital-to-analog converter connected downstream to the analog-to-digital converter;

a subtractor connected to the input terminal of the converter stage and to an output terminal of the digital-to-analog converter;

a switched-capacitor amplifier according to claim 1 connected to an output terminal of the subtractor to amplify a residue signal supplied by the output terminal of the subtractor.

13. The pipelined analog-to-digital converter of claim 12, wherein the analog-to-digital converters of the at least two converter stages are configured to perform a successive approximation digital-to-analog conversion and each comprise a plurality of capacitors, wherein a previous one of the at least two converter stages is configured to determine a number of most significant bits and another one of the at least two converter stages is configured to determine a number of least significant bits, the switched-capacitor amplifier is configured to amplify the residue signal of the previous one of the at least two converter stages and forward the amplified residue signal to the other one of the at least two converter stages.

14. The pipelined analog-to-digital converter of claim 13, wherein the time-to-digital converter of the switched-capacitor amplifier is configured to determine a signal dependent on the time to discharge the sample capacitor when operatively connected to the previous one of the at least two converter stages until the comparator detects the virtual ground condition, wherein a subset of the plurality of capacitors of the other one of the at least two converter stages is configured to be preset with a charge in response to the signal dependent on the time to discharge the sample capacitor.

15. The pipelined analog-to-digital converter of claim 13, wherein each one of the analog-to-digital converters of the at least two converter stages further comprise:

a terminal for a reference voltage potential and a terminal for a to be sampled input voltage potential, said terminals configured to be alternately coupled to one or more of the plurality of capacitors;

a circuit to generate a reference current in dependence on the reference voltage; and a circuit to generate the current of the charge current source in dependence on the reference current and a circuit to generate the current of the discharge current source in dependence on the reference current.

16. The pipelined analog-to-digital converter of claim 15, wherein the circuit to generate a reference current comprises a transistor, of which the source terminal is connected to a terminal for ground potential through a resistor and of which the drain terminal supplies the reference current, and an error amplifier connected to the terminal for a reference voltage potential and to the resistor, wherein the error amplifier controls the transistor.

* * * * *